United States Patent [19]
Saito et al.

[11] Patent Number: 5,314,541
[45] Date of Patent: May 24, 1994

[54] REDUCED PRESSURE PROCESSING SYSTEM AND REDUCED PRESSURE PROCESSING METHOD

[75] Inventors: Masasi Saito, Yamanashi; Teruo Iwata, Nirasaki; Nobuo Ishii, Yamanashi; Towl Ikeda, Kofu; Hiroaki Saeki, Yamanashi, all of Japan

[73] Assignee: Tokyo Electron Limited, Tokyo, Japan

[21] Appl. No.: 889,378

[22] Filed: May 28, 1992

[30] Foreign Application Priority Data

| May 28, 1991 | [JP] | Japan | 3-152633 |
| May 28, 1991 | [JP] | Japan | 3-152634 |
| Jul. 25, 1991 | [JP] | Japan | 3-186241 |

[51] Int. Cl.$^5$ ............................. C23C 16/00
[52] U.S. Cl. .......................... 118/725; 118/50; 118/724; 118/733
[58] Field of Search ............ 118/725, 733, 50, 50.1, 118/724

[56] References Cited

U.S. PATENT DOCUMENTS

| 4,640,223 | 2/1987 | Dozier | 118/728 |
| 4,680,061 | 7/1987 | Lamont, Jr. | 204/192.12 |
| 4,839,145 | 6/1989 | Gale et al. | 118/725 |
| 5,044,314 | 9/1991 | McNeilly | 118/719 |
| 5,121,705 | 6/1992 | Sugino | 118/719 |
| 5,182,231 | 1/1993 | Hengo et al. | 437/173 |

FOREIGN PATENT DOCUMENTS

| 59-66123 | 4/1984 | Japan . |
| 62-12129 | 1/1987 | Japan . |
| 2218126 | 8/1990 | Japan . |

*Primary Examiner*—Anthony McFarlane
*Attorney, Agent, or Firm*—Oblon, Spivak, McClelland, Maier & Neustadt

[57] ABSTRACT

A reduced pressure processing system includes a load lock chamber having an opening communicating with a process atmosphere in which a wafer is processed and/or the outer air atmosphere, a gate valve which is arranged at the opening to close/open the chamber with respect to the process atmosphere and/or the outer air atmosphere, a robot for loading/unloading the wafer into/from the chamber, an evacuation pump for evacuating the chamber, a heater for heating the wall of the chamber, and a controller for controlling the gate valve, the robot, the evacuation pump, and the heater.

9 Claims, 22 Drawing Sheets

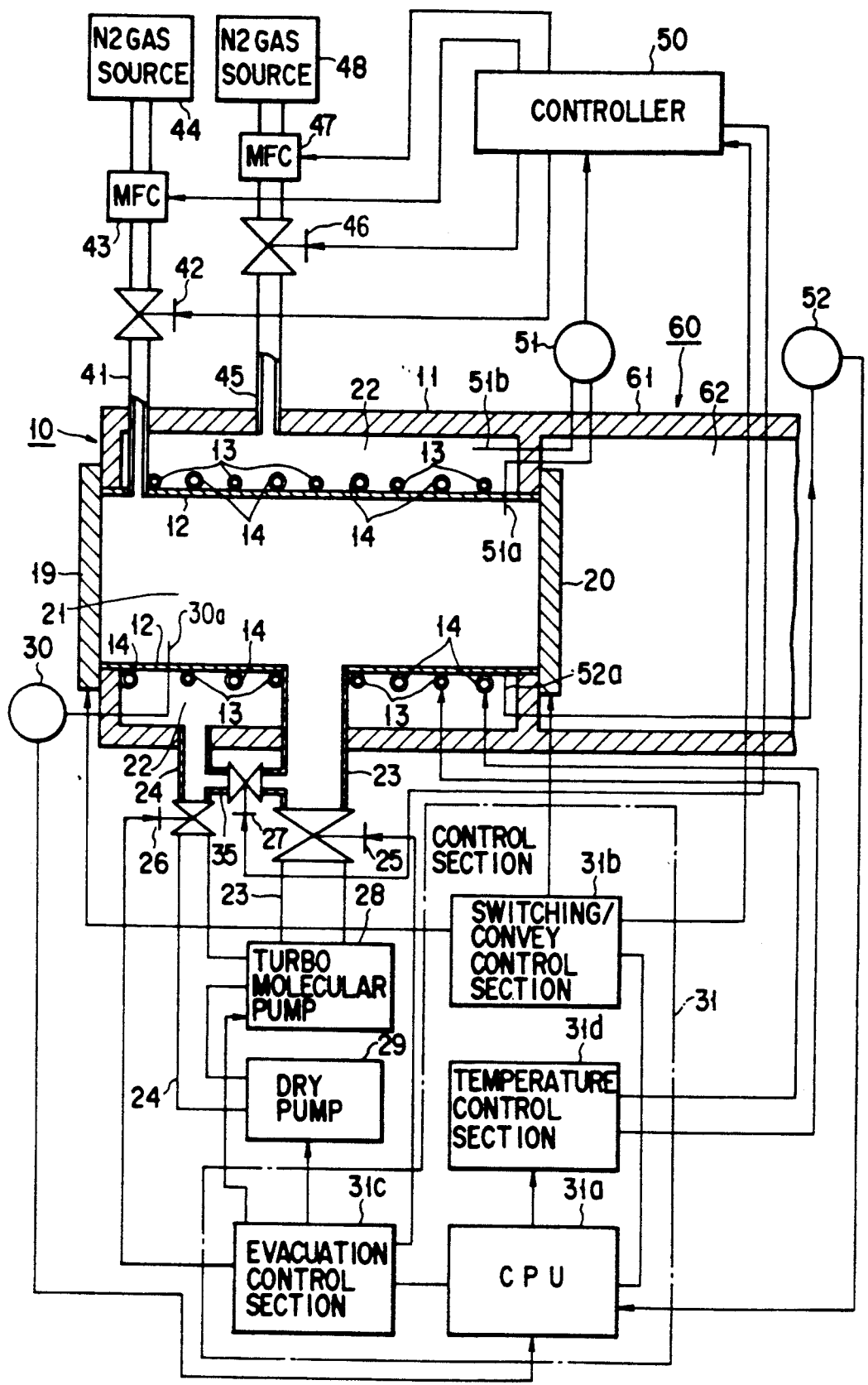
F I G. 3

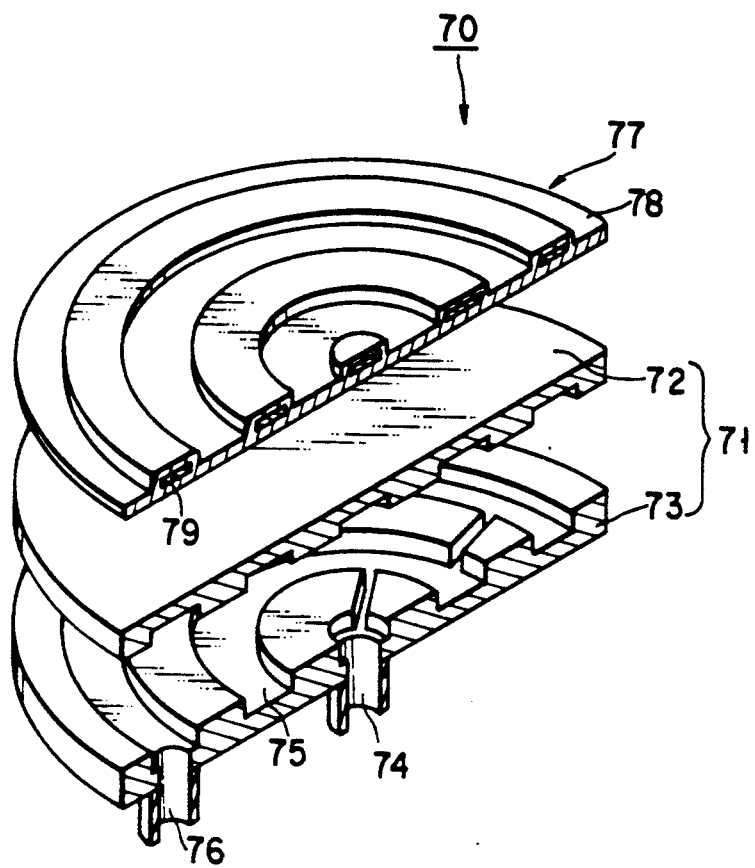
F I G. 5

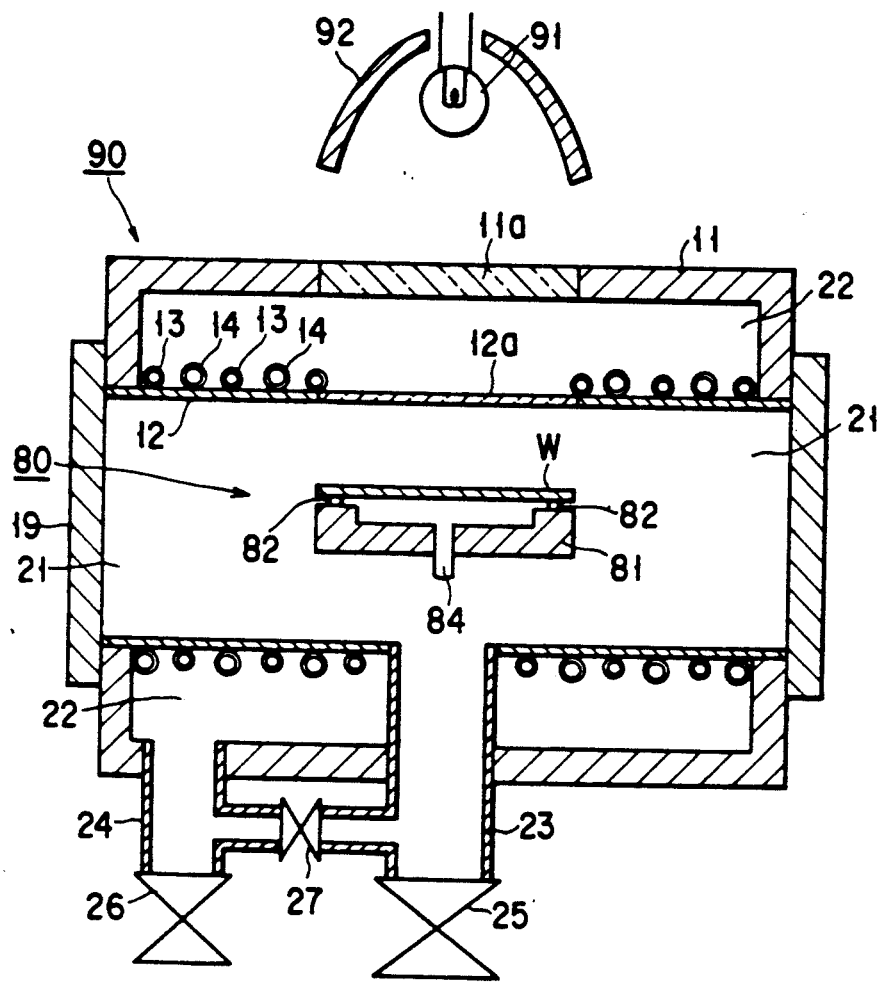
F I G. 9

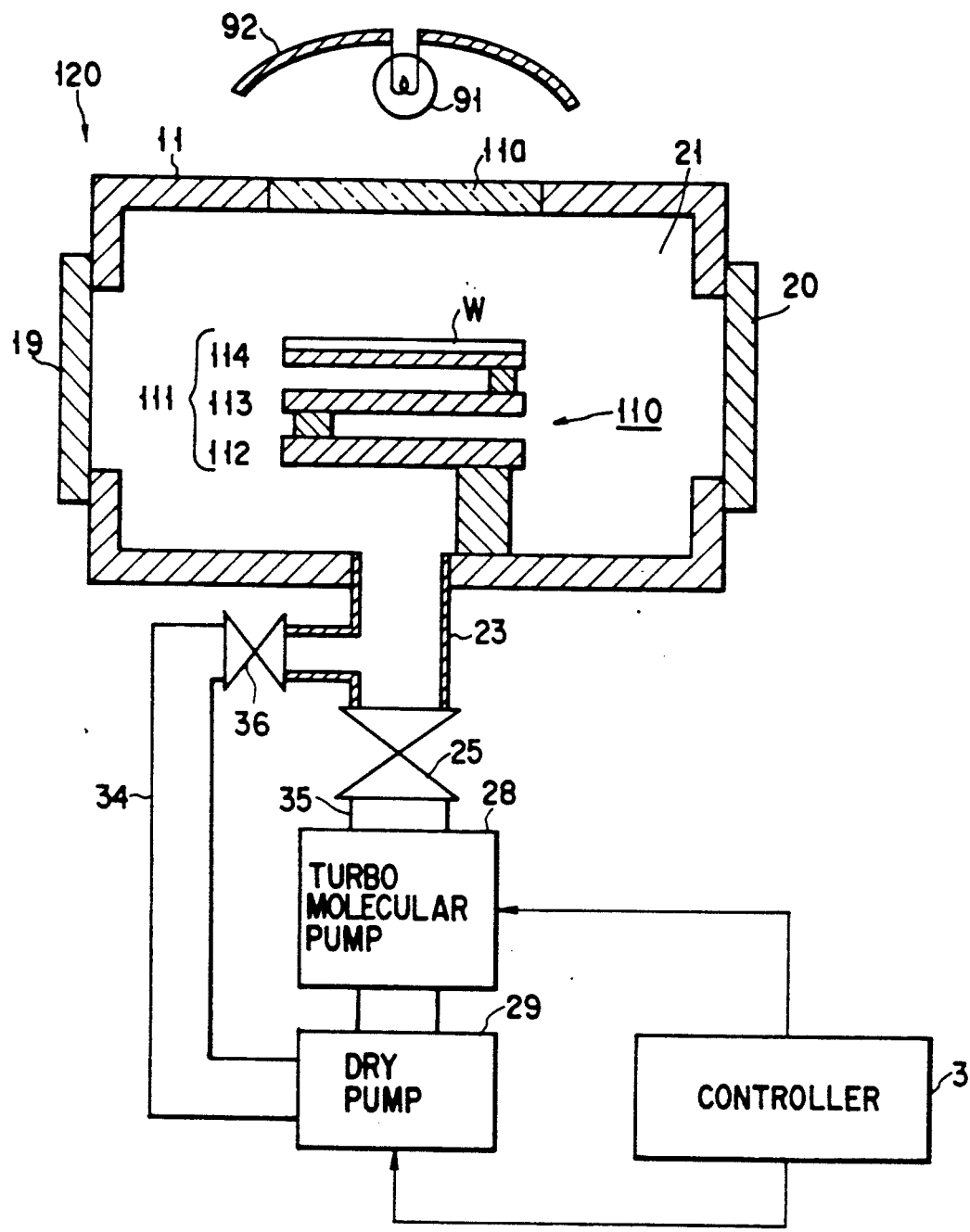
F I G. 11

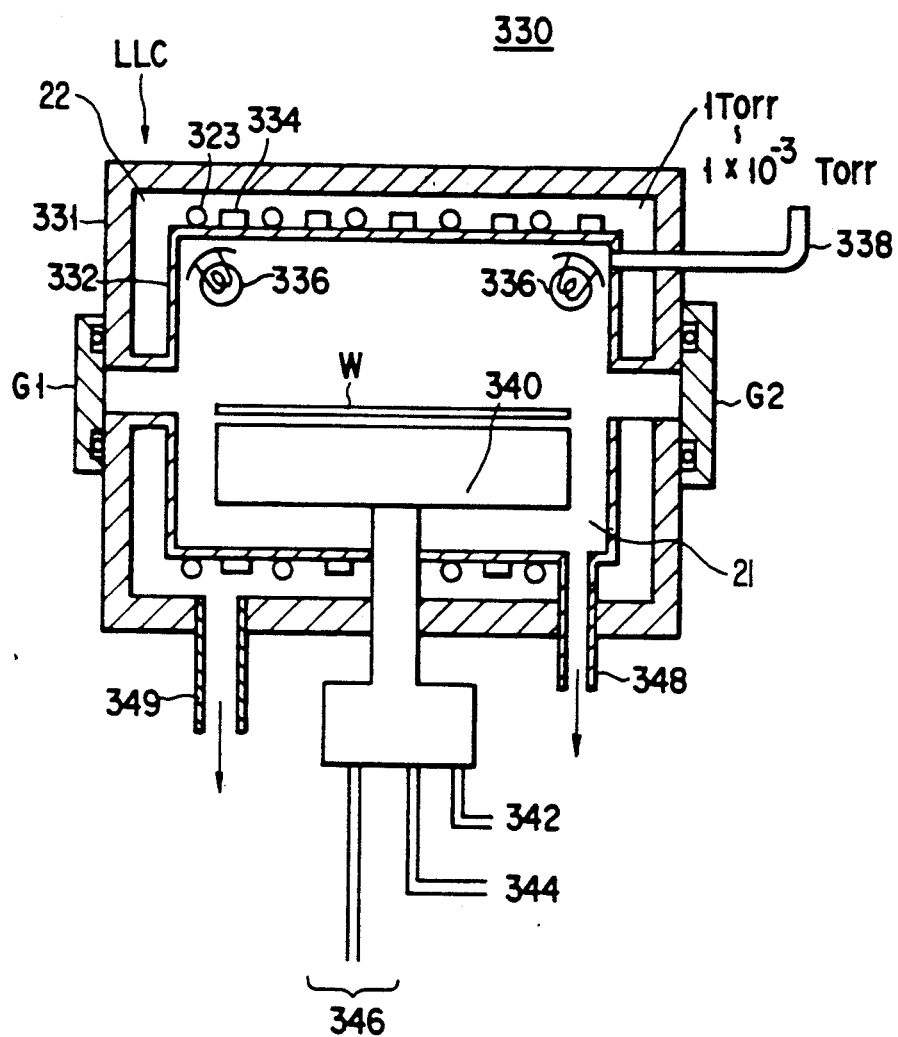
F I G. 14

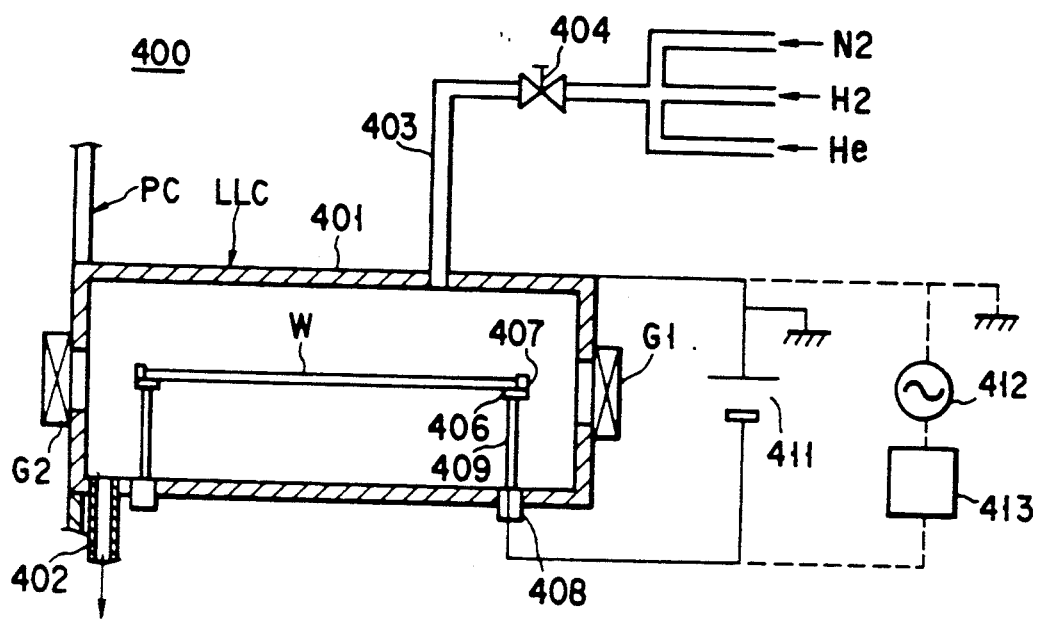
F I G. 15

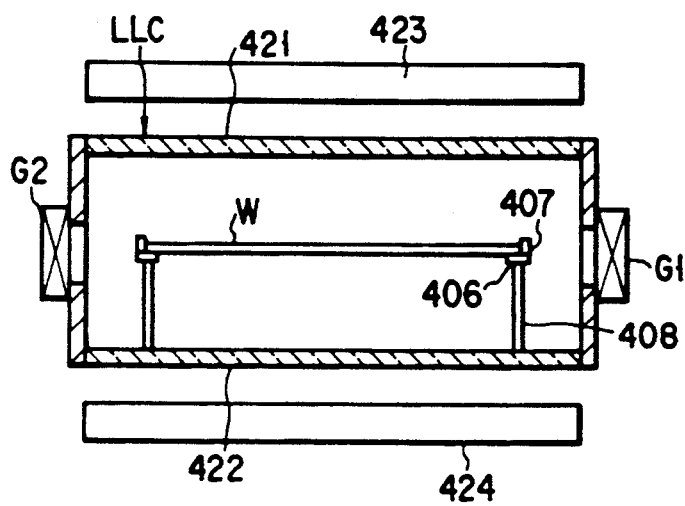
F I G. 16
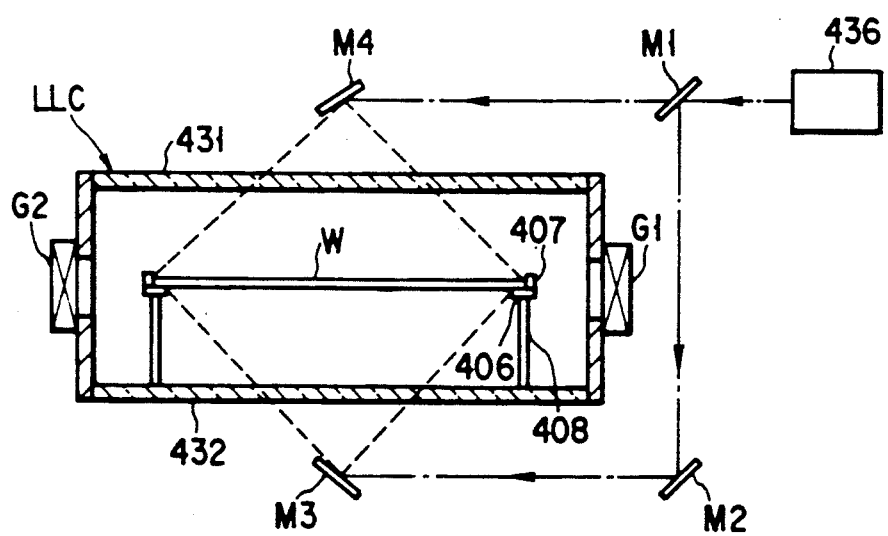
F I G. 17

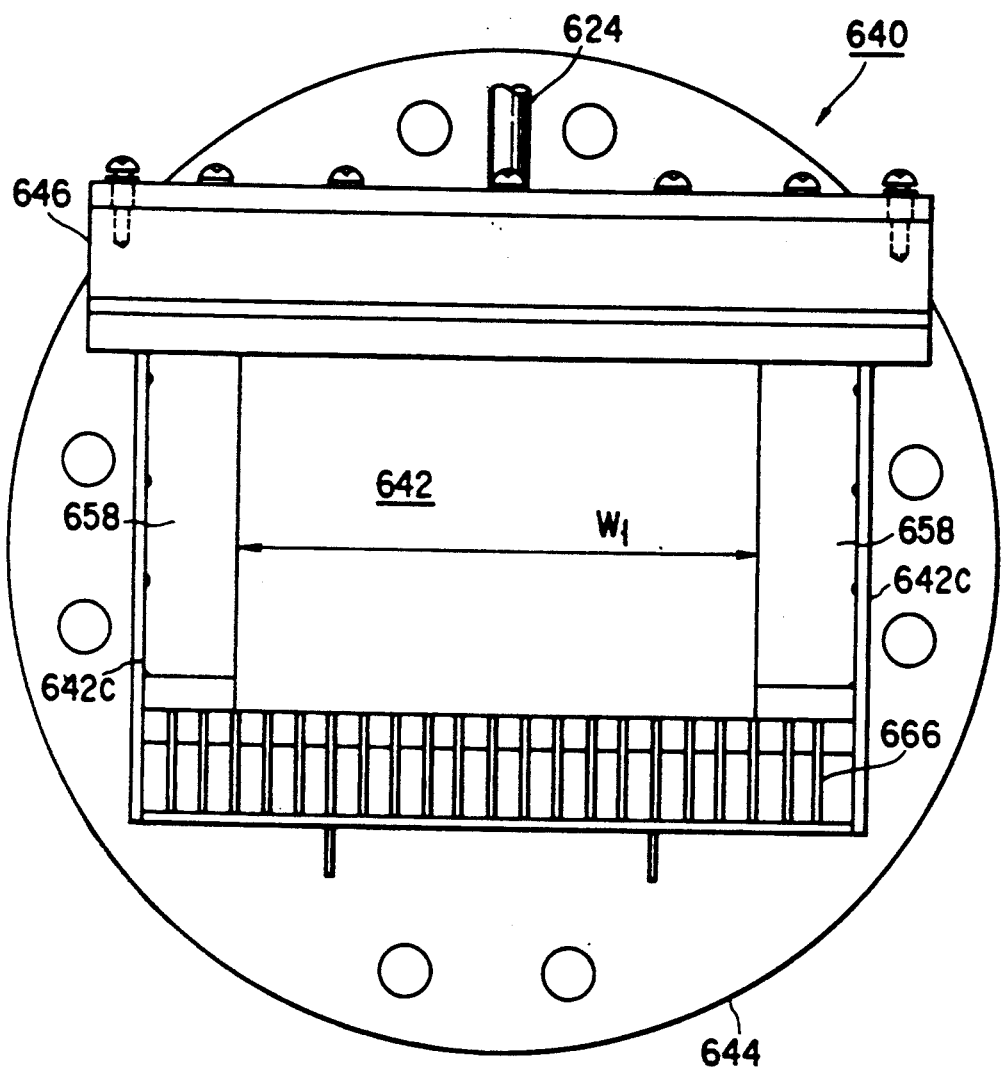
F I G. 22

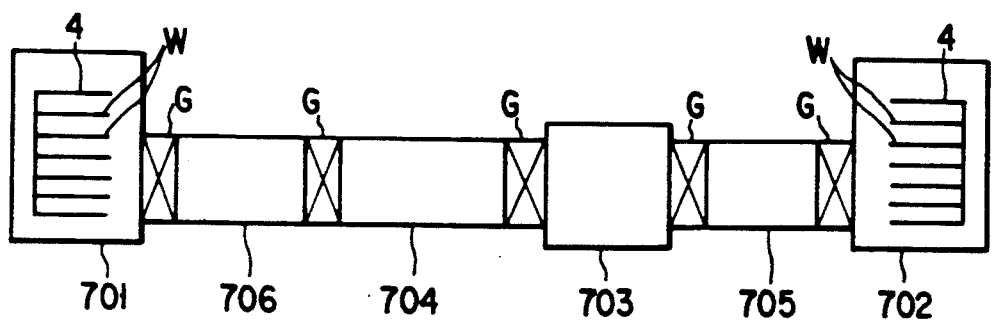
F I G. 23
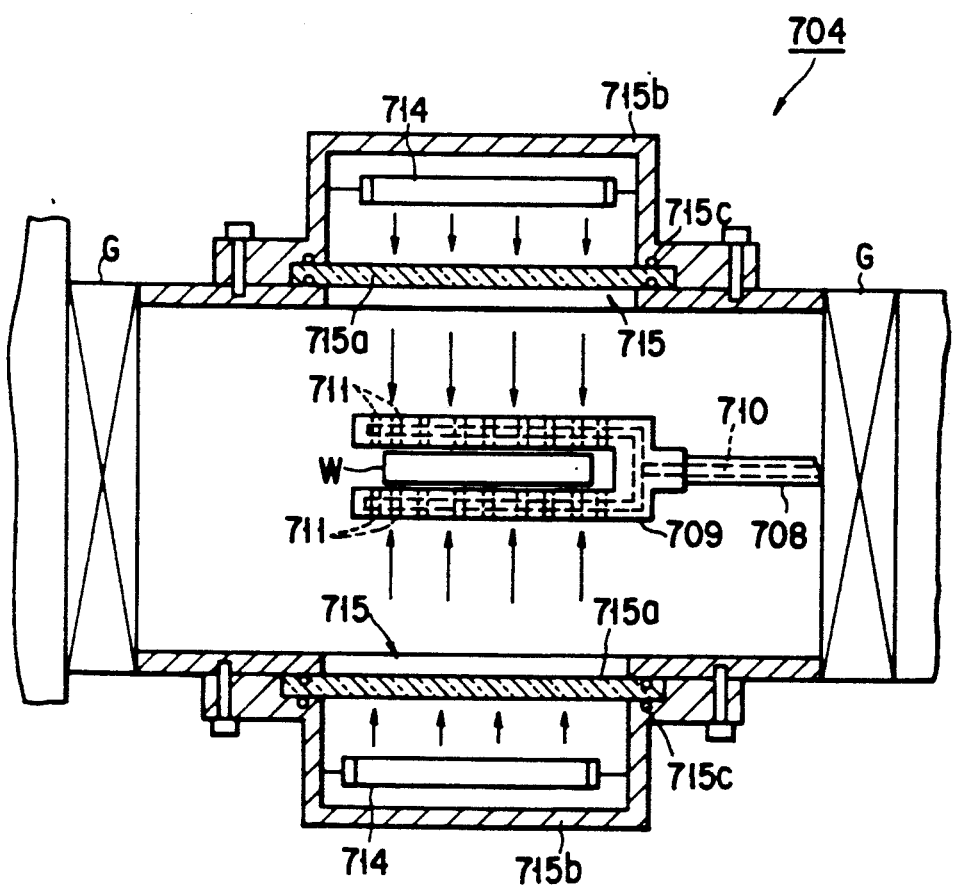
F I G. 24

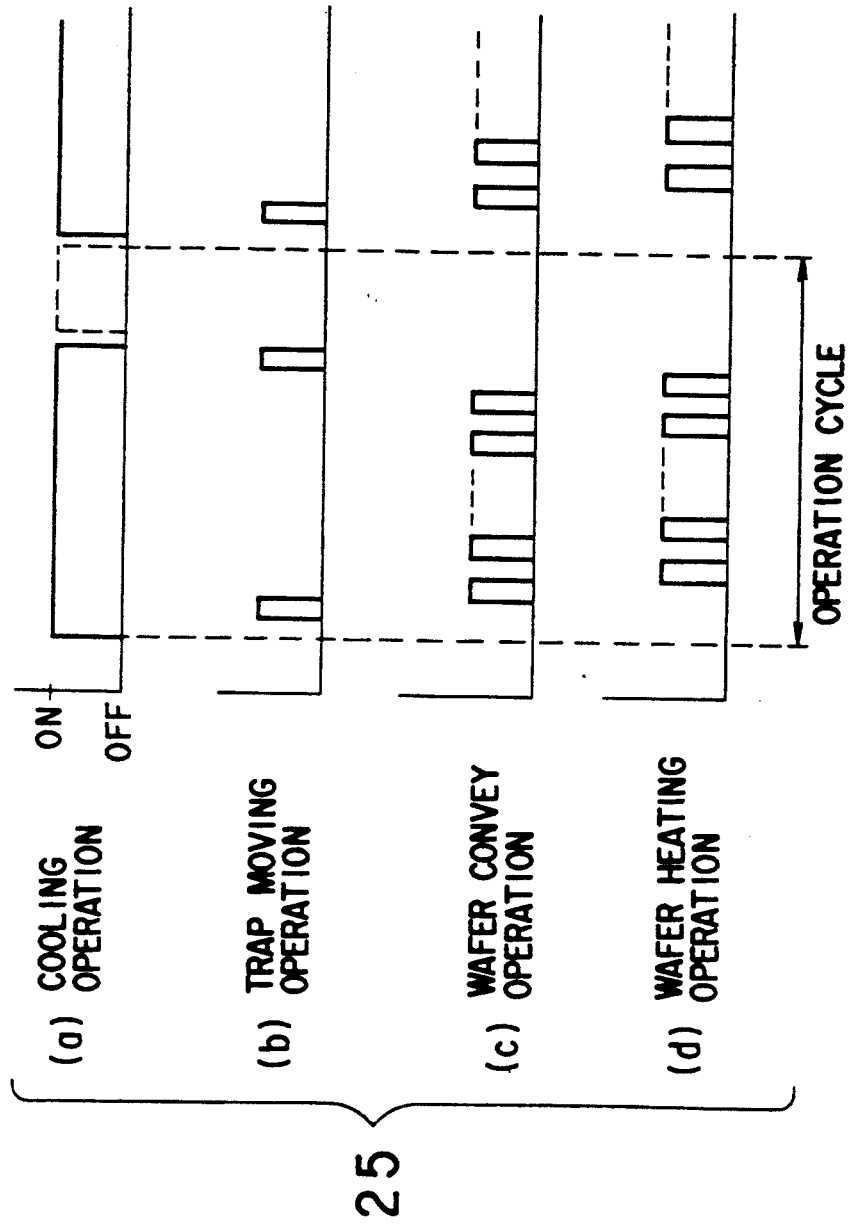

ced Pressure Processing System and Reduced Pressure Processing Method

BACKGROUND OF THE INVENTION

1. Field of the Invention

The present invention relates to a reduced pressure processing system and a reduced pressure processing method used for processing a semiconductor substrate, a liquid crystal substrate, and the like and, more particularly, to a system having a load lock chamber used as a preliminary chamber for a process chamber.

2. Description of the Related Art

A reduced pressure processing system is used in various types of processes, e.g., ion implantation, dry etching, and film formation with respect to a substrate serving as a basic member of a semiconductor device or a liquid crystal panel. The reduced pressure processing system controls the internal atmosphere of a chamber to a desired reduced pressure and isolates a process atmosphere from the outer air atmosphere.

When vacuum processing such as ion implantation is to be performed with respect to a semiconductor wafer, if the atmosphere is mixed in a wide vacuum processing chamber, it takes much time to evacuate the chamber to a high vacuum again. For this reason, wafers are normally loaded/unloaded into/from the process chamber through a load lock chamber.

In this case, the load lock chamber is minimized in size to minimize the time required for evacuation. If moisture, process gas components, and the like adhere to the wall constituting the load lock chamber, the time required for evacuation is prolonged, resulting in a decrease in throughput.

FIGS. 1A to 1D show conventional reduced pressure processing systems as typical examples. FIG. 1A shows a system in which a process chamber PC is singly arranged. FIG. 1B shows a system in which load lock chambers LL1 and LL2 are arranged before and after a process chamber PC. FIG. 1C shows a system in which cassette chambers CC1 and CC2 are arranged before and after a process chamber PC. FIG. 1D shows a system in which load lock chambers LL1 and LL2 and cassette chambers CC1 and CC2 are respectively arranged before and after a process chamber PC.

Gate valves G, each having an automatic switching mechanism, are respectively attached to the entrance and exit to and from each chamber. Each gate valve G is controlled by a controller backed up by a computer system to be interlocked with a convey mechanism (not shown), an evacuation mechanism (not shown), and the like.

In each of the systems shown in FIGS. 1A to 1C, the internal pressure of each chamber must be restored to the atmospheric pressure (1 atm) every time a wafer is loaded/unloaded. Therefore, it takes much time to evacuate each chamber to a high vacuum again, resulting in a decrease in throughput.

Under the circumstances, as shown in FIGS. 1D and 2, a reduced pressure processing system is proposed, in which the load lock chambers LL1 and LL2 are respectively arranged between the process chamber PC and the cassette chambers CC1 and CC2 to reduce the influence of the atmosphere on the process chamber PC. In this case, the process chamber PC, the load lock chambers LL1 and LL2, and the cassette chambers CC1 and CC2 are respectively evacuated by evacuation systems 5. A wafer stage 2 on which a wafer W is placed is arranged in the process chamber PC located in the middle of the system. Wafer cassettes 4 are respectively stored in the cassette chambers CC1 and CC2. Each cassette 4 contains a plurality of semiconductor wafers W. Wafer convey mechanisms (convey robots) 3 are respectively arranged in the load lock chambers LL1 and LL2. Each convey mechanism 3 has an articulated arm and serves to convey the semiconductor wafer W from the cassette chamber CC1 to the process chamber PC or from the process chamber PC to the cassette chamber CC2, i.e., has a handling function.

In the system shown in FIG. 2, however, the outermost chamber (LL1, LL2, CC1 or CC2) must be restored to the atmospheric pressure at a predetermined frequency with the progress of processing in the process chamber PC. Therefore, it takes much time to evacuate the chamber to a high vacuum again, resulting in a decrease in throughput. Especially, if moisture contained in the outer air adheres to the chamber wall, heat of vaporization is generated in evacuation to transform the moisture into ice particles (a large number of micro ice) which are difficult to remove, thus prolonging the time required for evacuation and decreasing the throughput.

In order to prevent this, for example, an inert gas such as nitrogen is fed into a chamber before it is restored to the atmospheric pressure, and the gas is blown out during a loading/unloading operation with respect to a substrate to be processed. However, it is difficult to satisfactorily prevent the entrance of water molecules which fly in the atmosphere at a high molecular speed, and hence the above-described countermeasure is not effective.

In addition, if film formation processing such as CVD is performed in the process chamber, small quantities of source gases used for the processing, reaction gases produced therefrom, and the like remain in the process chamber. These residual gases flow into a preliminary chamber or a storage chamber and adhere to its inner wall and the like when a substrate to be processed or a processed substrate is loaded/unloaded. As a result, the interior of the chamber is contaminated, and a defective product may be produced.

Furthermore, various molecules such as water molecules adhere to the surface of a substrate to be processed while it is exposed to the atmosphere before a loading operation. Even if such a substrate is loaded into the chamber, and evacuation is started, since the molecules adsorbed in its surface cannot be removed quickly, it takes much time to attain a high vacuum, resulting in a decrease in throughput.

SUMMARY OF THE INVENTION

It is an object of the present invention to provide a reduced pressure processing system and a reduced pressure processing method, which can evacuate a preliminary chamber such as a load lock chamber to a desired level within a short period of time.

According to an aspect of the invention, there is provided a reduced pressure processing system comprising a chamber having at least one opening communicating with a process atmosphere in which an object is processed and/or an outer air atmosphere, gate means, arranged at the opening, for closing/opening the chamber with respect to the process atmosphere and/or the outer air atmosphere, convey means for loading/unloading the object into/from the chamber, evacuation means for evacuating the chamber, heating means for heating a wall of the chamber, and control means for controlling at least one of the gate, convey, evacuation, and heating means.

In addition, according to an aspect of the invention, there is provided a reduced pressure processing method comprising the steps of causing convey means to load an object to be processed from a process atmosphere or an outer air atmosphere into a chamber, hermetically sealing the chamber, evacuating the chamber and heating a wall of the chamber, causing control means to control the evacuation/heating steps to set an internal pressure of the chamber to a target set value, and causing the convey means to unload the object from the chamber.

Since the chamber wall is heated to the vaporization point of water or more, adhering moisture can be easily removed from the chamber wall, and the internal pressure of the chamber can be caused to reach a predetermined level within a short period of time.

In addition, since heat energy is radiated from the chamber wall, moisture adhering to a wafer loaded into the chamber can be quickly removed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view, partially in cross-section, of a load lock system according to the first embodiment of the present invention;

FIG. 5 is a exploded perspective view showing the respective parts of the wafer stage;

FIG. 9 is a longitudinal sectional view showing a load lock chamber and a wafer stage according to the second embodiment of the present invention;

FIG. 11 is a view, partially in cross-section, of a load lock chamber and a wafer stage according to the fourth embodiment of the present invention;

FIG. 14 is a longitudinal sectional view showing a main part of a load lock system according to the sixth embodiment of the present invention;

FIG. 15 is a longitudinal sectional view showing a main part of a load lock system according to the seventh embodiment of the present invention;

FIG. 16 is a longitudinal sectional view showing a main part of a load lock system according to the eighth embodiment of the present invention;

FIG. 17 is a longitudinal sectional view showing a main part of a load lock system according to the ninth embodiment of the present invention;

FIG. 22 is a front view showing the opening portion of the load lock system of the eleventh embodiment;

FIG. 23 is a front view showing the overall arrangement of a load lock system according to the twelfth embodiment of the present invention;

FIG. 24 is a longitudinal sectional view showing the interior of a load lock chamber (trap unit) in the twelfth embodiment; and FIGS. 25(a) to 25(d) are timing charts of the respective operations of the trap unit.

DETAILED DESCRIPTION OF THE PREFERRED EMBODIMENTS

Figure 1A:
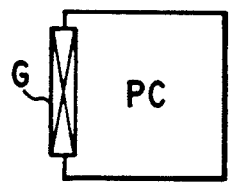
FIGS. 1A to 1D are views, each illustrating the layout of a conventional reduced pressure processing system having a single or a plurality of chambers.
Figure 1B:
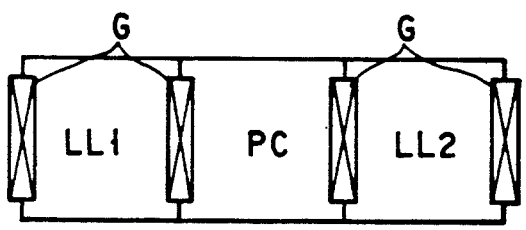
Figure 1C:
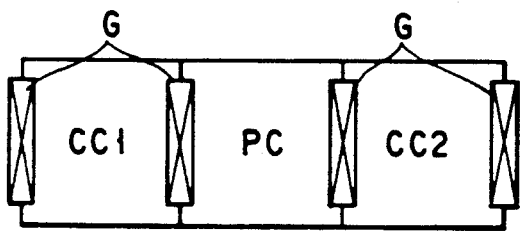
Figure 1D:
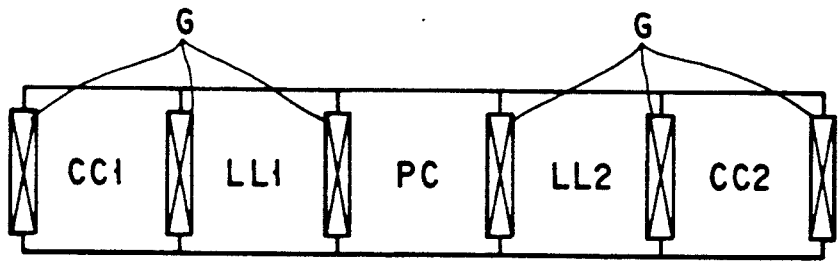
Figure 2:
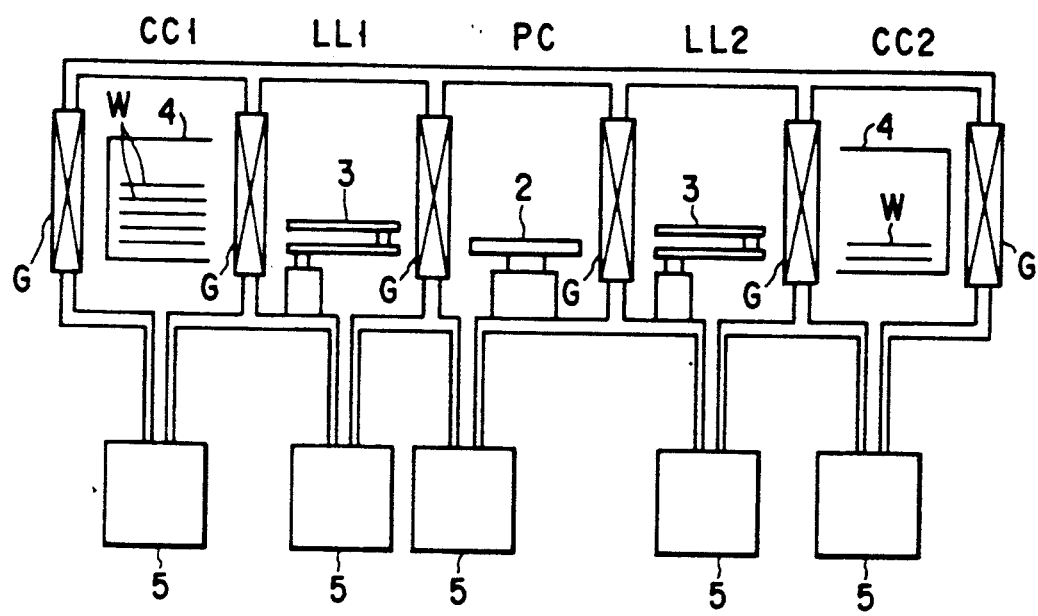
FIG. 2 is a sectional view schematically showing the interior of the conventional reduced pressure processing system in FIG. 1D.

FIG. 3 is a view, partially in cross-section, of a main part of a reduced pressure processing system according to the first embodiment of the present invention. A chamber 10 of the reduced pressure processing system is surrounded by walls 11 and 12 constituting a double wall. Openings in the two ends of the chamber 10 are respectively closed by gate valves 19 and 20. The chamber 10 is disposed adjacent to a process chamber 60 to serve as a load lock chamber.

The outer wall 11 of the double wall is composed of a thick plate such as a stainless steel plate or an aluminum alloy plate. The outer wall 11 is formed to be continuous with an outer wall 61 of the process chamber 60. The wall 11 has enough strength to withstand the difference between the atmospheric pressure and the internal pressure (a fraction of several hundred thousands of 1 atm).

The inner wall 12 of the double wall is composed of a thin plate such as a stainless steel plate. The inner wall 12 has enough strength to withstand a low pressure of nearly a fraction of several hundred thousands of 1 atm which is equal to the difference between a fraction of several hundred thousands of 1 atm acting on the outer surface of the wall 12 and substantially zero atmospheric pressure acting on the inner surface of the wall 12. A heater 13 and a water cooling pipe 14 are wound around the inner wall 12 at a predetermined pitch.

The inner wall 12 is coaxially disposed with respect to the outer wall 11. A first space (wafer convey path) 21 is defined by the inner wall 12 and the gate valves 19 and 20. A second space 22 is defined by the outer wall 11 and the inner wall 12.

The first gate valve 19 serves to isolate the outer air atmosphere from the wafer convey path atmosphere. The second gate valve 20 serves to isolate a process atmosphere from the wafer convey path atmosphere.

A cassette stage (not shown) is disposed in front of the first gate valve 19. A convey unit (not shown) is disposed near the cassette stage. Semiconductor wafers are taken out one by one from a cassette on the stage by the convey unit to be loaded into the load lock chamber 10.

An exhaust pipe 23 extends through the inner and outer walls 11 and 12, and one end of the pipe 23 communicates with the first space 21. The other end of the exhaust pipe 23 is connected to a turbo molecular pump 28 through a valve 25.

Another exhaust pipe 24 extends through the outer wall 11, and one end of the pipe 24 communicates with the second space 22. The other end of the exhaust pipe 24 is connected to both the turbo molecular pump 28 and a dry pump 29 through a valve 26. Note that a bypass pipe 35 is disposed between the exhaust pipes 23 and 24. A valve 27 is disposed in the bypass pipe 35. The exhaust side of the turbo molecular pump 28 is connected to the dry pump 29.

A first controller 31 includes a CPU 31a, a gate valve switching control/wafer convey control section 31b, an evacuation control section 31c, and a temperature control section 31d. The gate valve switching control/wafer convey control section 31b performs switching control of the gate valves 19 and 20 and controls loading/unloading operations of a wafer convey mechanism. The evacuation control section 31c controls starting/stopping operations of the pumps 28 and 29 and switching operations of the valves 25 and 26. The temperature control section 31d controls the amount of current supplied to the heater 13 and the amount of water supplied to the water cooling pipe 14.

The CPU 31a operates the respective control sections 31b, 31c, and 31d in cooperation with each other at a predetermined timing in accordance with an internal pressure detection signal and a temperature detection signal. Note that a probe 30a of a manometer 30 is disposed in the first space 21 to detect the internal pressure in the first space 21. The manometer 30 is connected to the CPU 31a.

A probe 52a of a temperature sensor 52 is attached to the inner wall 12 to detect its temperature. The temperature sensor 52 is connected to the CPU 31a. In this embodiment, the probe 52a of the temperature sensor 52 is attached to the inner wall 12. However, the present invention is not limited to this, but the probe 52a may be disposed on the wafer stage 70.

One end of a gas supply pipe 41 communicates with the first space 21. The other end of the gas supply pipe 41 communicates with an $N_2$ gas source 44 through a valve 42 and a mass flow controller (to be referred to as an MFC hereinafter) 43.

One end of a gas supply pipe 45 communicates with the second space 22. The other end of the gas supply pipe 45 communicates with an $N_2$ gas source 48 through a valve 46 and an MFC 47.

The valves 42 and 46 and the MFCs 43 and 47 are connected to the output side of a second controller 50.

A differential manometer 51 is connected to the input side of the second controller 50. Probes 51a and 51b of the differential manometer 51 are respectively disposed in the first and second spaces 21 and 22. The output side of the second controller 50 is connected to the valves 42 and 46, the MFCs 43 and 47, and the bypass valve 27.

The second controller 50 controls switching operations of the bypass valve 27 on the basis of detection signals from the differential manometer 51. In this case, the second controller 50 is programmed to control the opening degree of the bypass valve 27 such that the difference in pressure between the first and second spaces 21 and 22 does not become 10 Torr or more.

In addition, the second controller 50 controls switching operations of the valves 42 and 46 and performs flow control of the MFCs 43 and 47 on the basis of command signals from the gate valve switching/wafer convey control section 31b.

In the initial stage of evacuation, the first space 21 is caused to communicate with the dry pump 29 through the exhaust pipe 23, the bypass valve 27, and the valve 26 so as to undergo initial evacuation. In addition, in the intermediate and final stages of evacuation, the first space 21 is caused to communicate with the turbo molecular pump 28 through the valve 25 so as to be evacuated to a high vacuum of about $10^{-9}$ Torr.

Meanwhile, the second space 22 is caused to communicate with the dry pump 29 through the exhaust pipe 24 and the valve 26 so as to be evacuated to a low vacuum of about $10^{-2}$ Torr.

Figure 4:
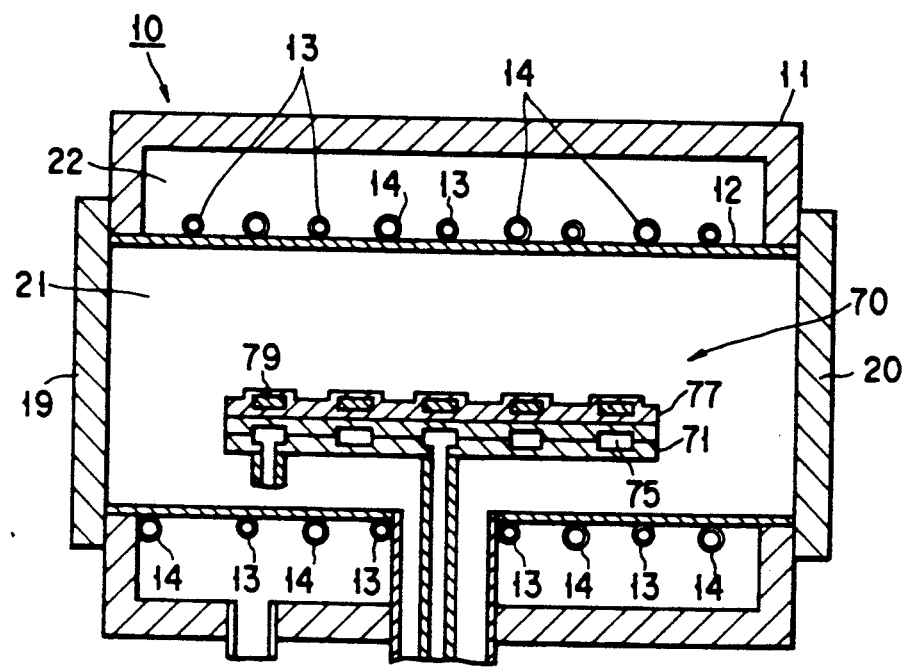
FIG. 4 is a longitudinal sectional view showing a load lock chamber and a wafer stage in the first embodiment.

As shown in FIG. 4, a wafer stage 70 having cooling and heating functions may be disposed in the load lock chamber 10.

As shown in FIG. 5, the wafer stage 70 includes a lower plate 71 having a cooling mechanism and an upper plate 77 having a heating mechanism and stacked on the lower plate 71. The lower plate 71 is formed by bonding upper and lower plate members 72 and 73 to each other. A water cooling path 75 is formed between the upper and lower plate members 72 and 73. The water cooling path 75 communicates with a water supply port 74 and a water discharge port 76.

The upper plate 77 includes an insulating ceramic casing 78 and a conductive ceramic electric heater 79. The three heating elements of the electric heater 79 are concentrically embedded in the casing 78. Note that a power source (not shown) for the electric heater 79 and a cooling water source (not shown) for the water cooling path 75 are controlled by the temperature control section 31d of the first controller.

Figure 6:
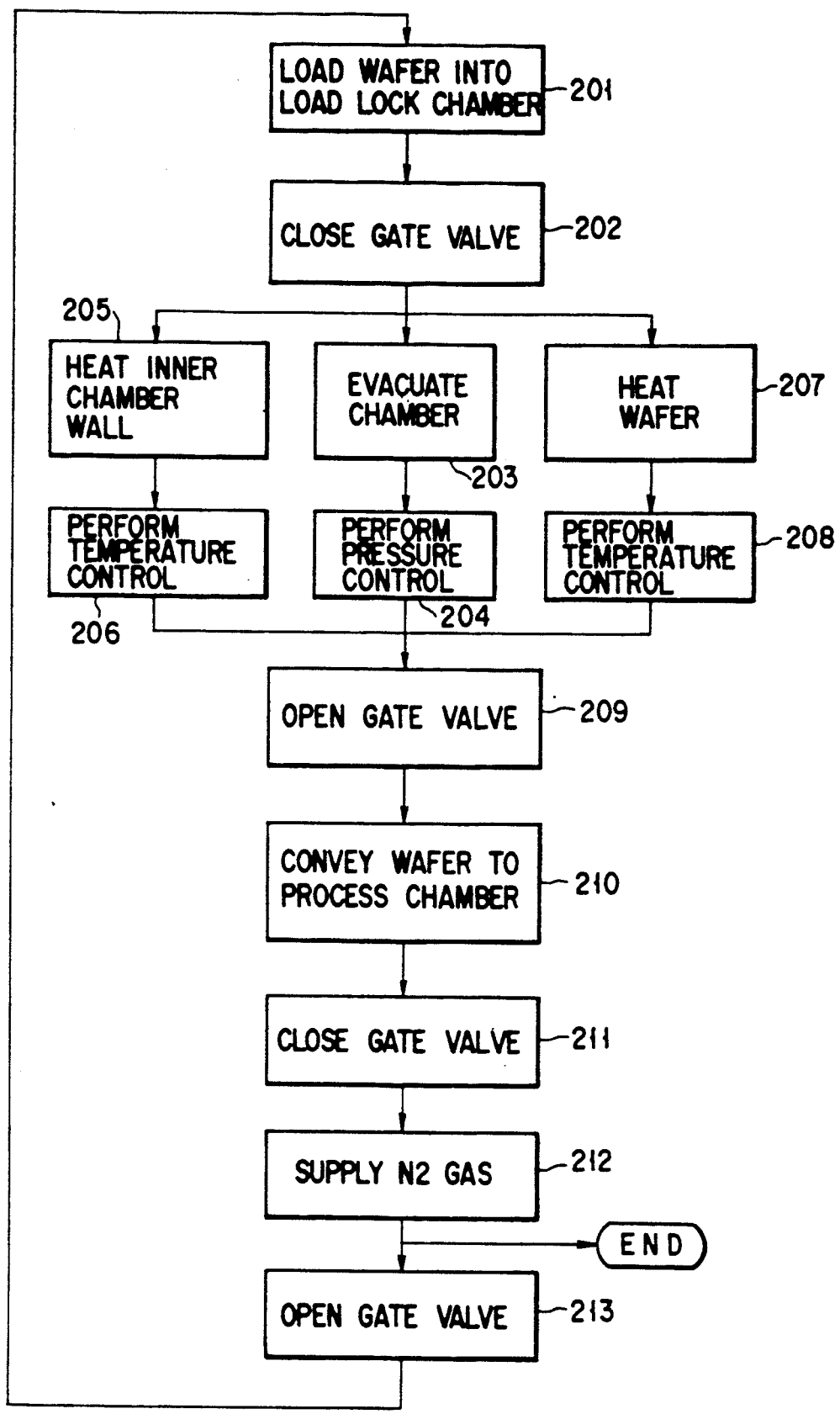
FIG. 6 is a flow chart showing the process of loading-/unloading a wafer into/from the load lock chamber.

A case wherein semiconductor wafers W are loaded into the process chamber by the load lock system of the first embodiment will be described below with reference to FIG. 6.

One of the semiconductor wafers W is taken out from the cassette by the convey unit. The first gate valve 19 is then opened, and the wafer W is loaded into the chamber 10 (step 201). After the wafer W is placed on the stage 70, the arm of the convey unit is retracted, and the gate valve 19 is closed (step 202).

The first and second spaces 21 and 22 of the chamber 10 are evacuated (step 203). At this time, the bypass valve 27 is controlled by the controller 50 on the basis of a differential pressure detection signal from the manometer 51 in such a manner that the difference in pressure between the two spaces 21 and 22 does not exceed 10 Torr (step 204). Finally, the internal pressures of the first and second spaces 21 and 22 are respectively set to be about $10^{-9}$ Torr and $10^{-2}$ Torr.

In addition, the inner chamber wall 12 is heated by the heater 13 concurrently with evacuation steps 203 and 204 (step 205). The amount of current supplied to the heater 13 is controlled by the controller 31 on the basis of a temperature detection signal from the temperature sensor 52 (step 206). With this heating operation, the inner chamber wall 12 is heated to about 140° C.

Furthermore, concurrently with this operation, a current is supplied to the heater 79 of the wafer stage 70 to heat the wafer W (step 207). Similarly, in this case, the amount of current supplied to the heater 79 is controlled by the controller 31 on the basis of a temperature detection signal so as to control the heating temperature of the wafer W (step 208).

Figure 7A:
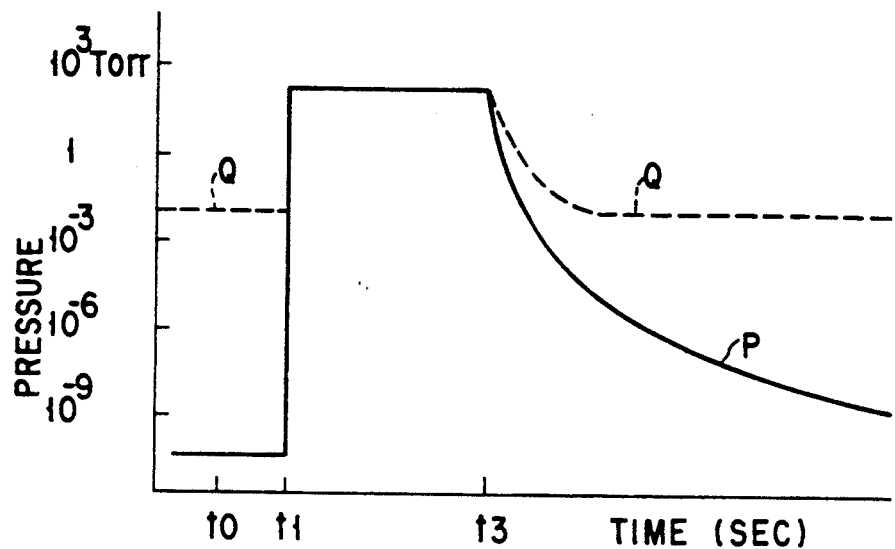
FIG. 7A is a graph showing changes in pressure inside and outside the load lock chamber as a function of time.

FIG. 7A is a graph in which the time elapsed after the gate valve 19 is closed is plotted along the abscissa and the internal pressure is plotted along the ordinate to show the result obtained by checking their relationship. Referring to FIG. 7A, a solid curve P indicates a variation in pressure of the first space 21, and a broken curve Q indicates a variation in pressure of the second space 22.

Figure 7B:
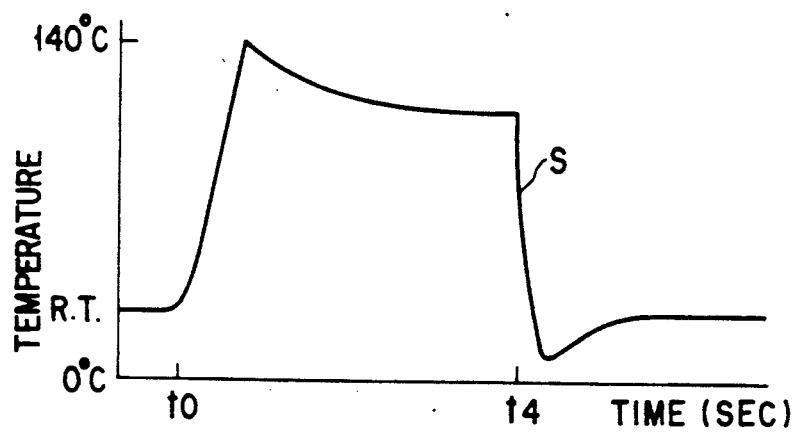
FIG. 7B is a graph showing a change in temperature of the inner chamber wall as a function of time.

FIG. 7B is a graph in which the time elapsed after the gate valve 19 is closed is plotted along the abscissa and the temperature is plotted along the ordinate to show the result obtained by checking their relationship. Referring to FIG. 7B, a solid curve S indicates a variation in temperature of the inner chamber wall 12.

Figure 7C:
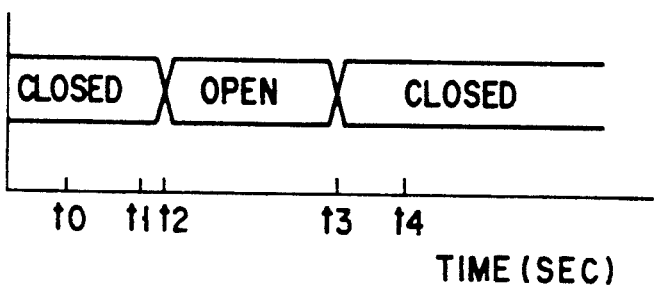
FIG. 7C is a timing chart showing the switching operations of a gate valve.

FIG. 7C is a timing chart showing switching operations of the first gate valve 19.

At time $t_0$, the current supply to the heater 13 is started to quickly increase the temperature of the inner chamber wall 12 from room temperature to about 140° C. At the same time, the wafer W on the stage 70 is heated. The wafer W is also heated by radiant heat radiated from the inner chamber wall 12. During these evacuation and heating steps, the internal pressure of the first space 21 is detected by the manometer 30, and the detection signal is input to the CPU 31a.

When the internal pressure of the first space 21 reaches $10^{-9}$ Torr or less, the second gate valve 20 is opened (step 209). With this operation, the load lock chamber 10 and the process chamber 60 are caused to communicate with each other. The wafer W is conveyed from the load lock chamber 10 into the process chamber 60 by means of the convey unit (not shown) (step 210). The second gate valve 20 is closed (step 211).

At time $t_1$, the exhaust valves 25 and 26 are closed. Subsequently, an $N_2$ gas is fed into the first and second spaces 21 and 22 to restore the internal pressures of the spaces 21 and 22 to a value near the atmospheric pressure (step 212). At this time, the series of steps of loading the wafer W may be ended.

If such loading process is to be continued, the first gate valve 19 is opened at time $t_2$ (step 213). Subsequently, steps 201 to 212 are repeated in the same manner as described above.

After loading of the wafer W is completed, at time $t_3$, the first gate valve 19 is closed, and at the same time the exhaust valves 25 and 26 are simultaneously opened to start initial evacuation of the first and second spaces 21 and 22.

Initial evacuation of the first space 21 is performed by the dry pump 29. The exhaust valve 27 is closed, and the valve 26 is opened to start final evacuation by means of the turbo molecular pump 28.

At time $t_4$, the current supply to the heater 13 is stopped, and at the same time cooling water is supplied to the water cooling pipe 14. With this operation, the temperature of the inner chamber wall 12 is quickly decreased in a dry state.

According to the load lock system described above, since the inner chamber wall 12 and the wafer stage 70 are heated, even if the first space 21 is exposed to the atmosphere, adhesion of moisture and the like to the respective portions (the chamber wall 12, the wafer W, the stage 70, and the like) in the chamber 10 can be effectively prevented.

In addition, since the heat capacity of the inner chamber wall 12 is reduced by decreasing its thickness, the response characteristic to heating/cooling operations is improved, and the evacuation time is greatly shortened, thus greatly increasing the throughput.

Furthermore, since the first and second spaces 21 and 22 are hermetically sealed, the load of the turbo molecular pump 28 is reduced.

Figure 8:
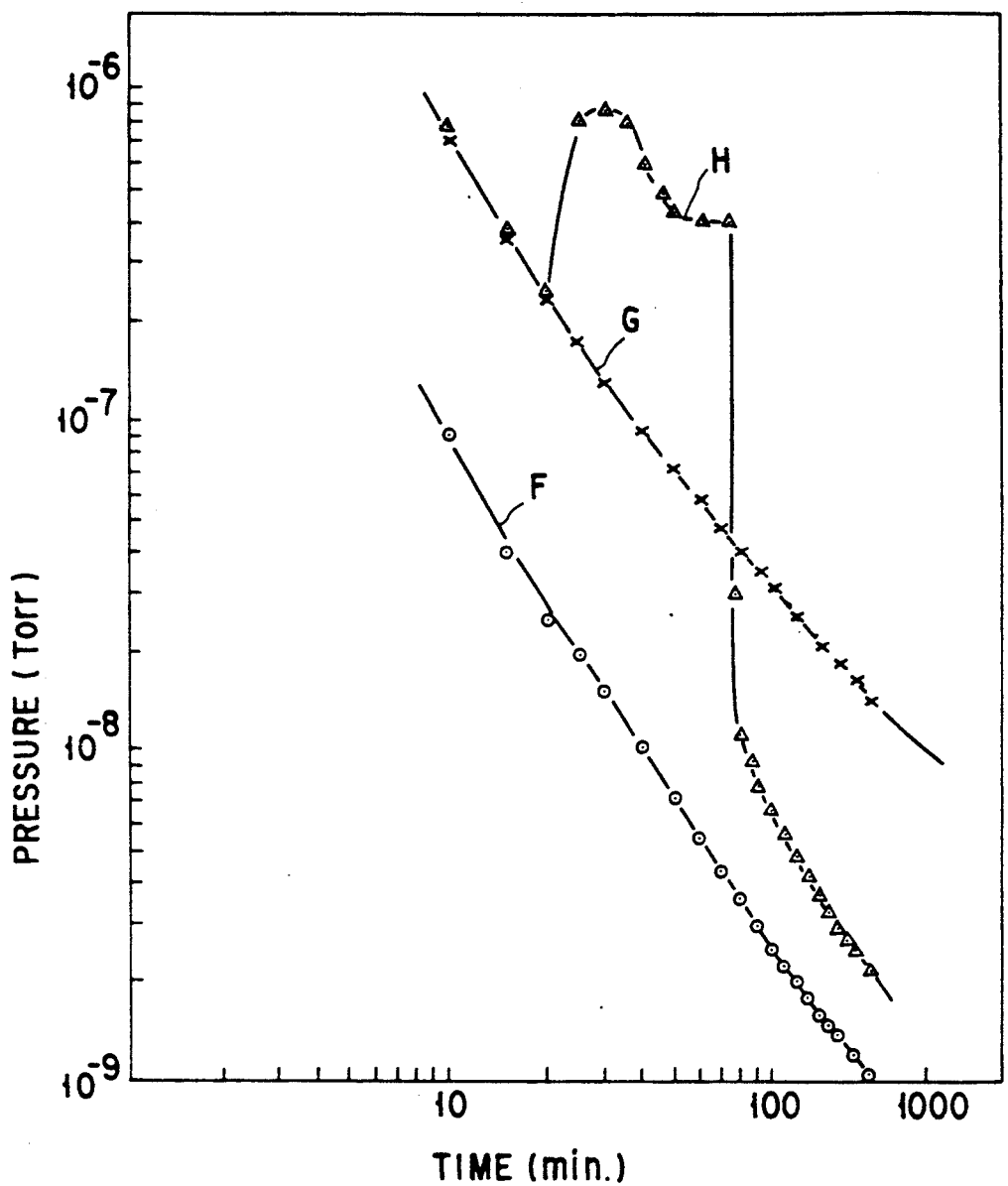
FIG. 8 is a graph showing the result obtained by checking internal pressure changes in the load lock chambers in the first embodiment and in comparative examples.

FIG. 8 is a graph in which the evacuation time is plotted along the abscissa, and the internal pressure of the first space 21 of the chamber 10 is plotted along the ordinate to show the result obtained by repeating experiments under various evacuation/temperature conditions and checking the relationship between the evacuation time and the internal pressure. The evacuation time corresponds to the elapsed time from the time when evacuation of the hermetically sealed first space 21 is started after the inner chamber wall 12 is exposed to the atmosphere. Referring to FIG. 8, a curve F is an evacuation characteristic curve obtained in a case wherein the inner chamber wall 12 is kept at 140° C. for three minutes corresponding to the time interval between the instant immediately before the gate valve 19 is opened and the instant at which the valve 19 is closed to start evacuation. A curve G is an evacuation characteristic curve obtained in a case wherein the inner chamber wall 12 is not heated. A curve H is an evacuation characteristic curve obtained in a case wherein the inner chamber wall 12 is not heated while it is exposed to the atmosphere, and the wall 12 is kept at 140° C. for about 60 minutes after the elapse of 20 minutes upon starting of evacuation. The characteristic represented by the curve H is known as the evacuation characteristic of baking on condition that wafer W is unloaded.

As is apparent from FIG. 8, the evacuation characteristic represented by the curve F is superior to the characteristics represented by the curves G and H. That is, according to this embodiment, the time required for evacuation can be greatly shortened. In contrast to this, according to the comparative examples indicated by the curves G and H, since the wall chamber is not heated before the wall is exposed to the atmosphere, moisture in the atmosphere adheres to the chamber wall, resulting in a deterioration in evacuation characteristic.

As is apparent from the curve G in FIG. 8, in the conventional method, it takes about 40 minutes to attain a vacuum of $10^{-7}$ Torr from the atmospheric pressure, and about 1,000 minutes are required to attain a vacuum of $10^{-8}$ Torr. In contrast to this, in the embodiment, as is apparent from the curve F, about 9 minutes and about 40 minutes are respectively required to attain the respective vacuums. That is, the evacuation processing time is shortened to 1/4 to 1/25 that in the conventional method. In the apparatus of the embodiment, hot air or vapor of liquid nitrogen may be introduced into the second space 22. Furthermore, in the evacuation processing, after substances adhering to the inner chamber wall 12 and the wafer W are removed by heating the wall 12 and the wafer W, a predetermined amount of dry nitrogen gas or dry argon gas may be fed into the first space 21 to cool the inner chamber wall 12 and the wafer W.

In addition, even if the inner chamber wall 12 is left to stand at room temperature and atmospheric pressure for a long period of time, e.g., one day or more, the evacuation processing time can be shortened in the following manner, similar to the above description. The inner chamber wall 12 is kept in a heated state in the time interval between the instant immediately before, e.g., five minutes before, the start of evacuation and the instant a predetermined period of time, e.g., five minutes, after the start of evacuation, so as to remove substances adhering to the wall. Thereafter, the inner chamber wall 12 and the wafer W are cooled.

FIG. 9 is a sectional view showing a main part of a load lock system according to the second embodiment of the present invention. Note that a description of portions of the second embodiment which are common to the above-described first embodiment will be omitted. A load lock chamber 90 has a double wall structure including a pair of windows 11a and 12a. An outer chamber wall 11 is composed of a thick metal plate. The window 11a is fitted in an upper middle portion of the wall 11. An inner chamber wall 12 is composed of a thin metal plate. The window 12a is fitted in an upper middle portion of the wall 12.

Each of the windows 11a and 12a is composed of a light-transmitting plate consisting of quartz or the like. An infrared lamp 91 and a reflector 92 are disposed above the windows 11a and 12a. A heater 13 and a water cooling pipe 14 are wound around the inner chamber wall 12 except for the window 12a.

A wafer stage 80 is disposed in the chamber 90. The wafer stage 80 includes a base plate 81 and pins 82. The peripheral portion of the base plate 81 protrudes upward from the remaining portion to form a recess in the central portion. The pins 82 are formed upright on the upper surface of the peripheral portion of the base plate 81 at equal intervals. These pins 82 can be caused to protrude/retract from the plate 81 by remote control.

A refrigerant injection pipe 84 extends through the central portion of the plate 81. The refrigerant injection pipe 84 communicates with a liquid nitrogen source (not shown) outside the chamber.

Note that in this load lock system, a controller (not shown) identical to the controller 31 in the first embodiment is arranged adjacent to the chamber 90. A temperature control section 31d in the controller controls the temperatures of the inner chamber wall 12 and the wafer stage 80 at the same timing as in the first embodiment.

An operation of the load lock system of the second embodiment will be described below.

Before first and second gate valves 19 and 20 are opened, the heater 13 and the infrared lamp 91 are turned on to heat the inner chamber wall 12 and the wafer stage 80 to about 140° C. The first gate valve 19 is then opened, and a wafer W is loaded into the chamber 90. The wafer W is placed on the wafer stage 80, and the first gate valve 19 is closed.

Subsequently, the infrared lamp 91 is turned on to irradiate the wafer W with infrared rays to heat it. In this heating period, the pins 82 are caused to protrude upward from the base plate 81 to lift the wafer W from the base plate 81 so as to reduce the heat conduction therebetween. With this operation, the wafer W is heated to a high temperature within a short period of time.

The wafer W is conveyed from the load lock chamber 90 into a process chamber (not shown), and the gate valve 20 is closed. When a predetermined period of time elapses after the gate valve 20 is closed, the current supply to the heater 13 and the infrared lamp 91 is stopped. Immediately after this operation, the supply of water to the water cooling pipe 14 and the supply of liquid nitrogen to the refrigerant injection pipe 84 are started to forcibly cool the inner chamber wall 12 and the wafer stage 80. During this cooling period, the pins 82 are retracted downward from the upper surface of the base plate 81. With this operation, the wafer W is brought into contact with the peripheral portion of the base plate 81 to increase the heat conduction therebetween. Meanwhile, the nitrogen gas (exhaust gas) is exhausted under a proper exhaust resistance between the wafer W and the peripheral portion of the base plate 81.

In the second embodiment, the inner chamber wall is heated/cooled together with the incorporated units such as the wafer stage. However, the cooling mechanisms may be omitted from both the wall and the containing unit such as the wafer stage so that the wall and the wafer stage are cooled only by heat radiation.

Figure 10:
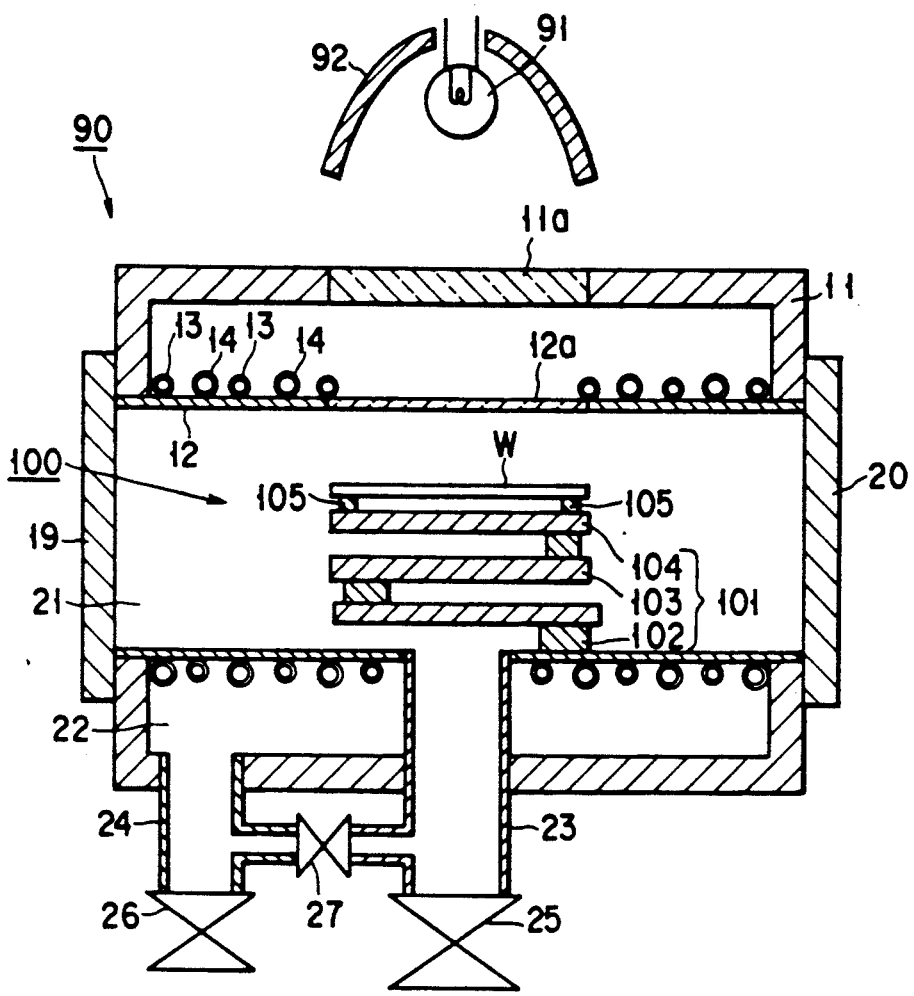
FIG. 10 is a longitudinal sectional view showing a load lock chamber and a wafer stage according to the third embodiment of the present invention.

FIG. 10 is a sectional view showing a main part of a load lock system according to the third embodiment of the present invention. A description of portions of the third embodiment which are common to the first and second embodiments will be omitted.

In the load lock system of the third embodiment, a wafer convey mechanism 100 is arranged in the load lock chamber 90 in the second embodiment instead of the wafer stage 80. The wafer convey mechanism 100 has an articulated arm 101 for conveying wafers W one by one. The articulated arm 101 includes a multiple link mechanism 103 constituted by links coupled to each other by pins. The articulated arm 101 can be extended/contracted by means of a stepping motor (not shown).

A base portion 102 of the articulated arm 101 is supported on the driving shaft of another stepping motor (not shown) to be rotated within a horizontal plane.

A holder 104 for holding the wafer W is disposed on the distal end (uppermost link) of the articulated arm 101. A plurality of pins 105 extend from the upper surface of the holder 104. These pins 105 can be protruded/retracted from the upper surface of the holder 104 by remote control.

A case wherein the wafer W is conveyed to a process chamber by using such a load lock system will be described below.

A first gate valve 19 is opened, and the articulated arm 101 of the convey mechanism 100 is extended and contracted to load the wafer W into the chamber 90. The gate valve 19 is then closed, and first and second spaces 21 and 22 are evacuated. Meanwhile, an inner chamber wall 12 is heated by a heater 13, and the wafer W is heated by an infrared lamp 91. At this time, the pins 105 are caused to protrude to lift the wafer W from the holder 104 to reduce the heat energy loss caused therebetween. With this operation, water molecules adhering to the inner chamber wall 12 can be sufficiently removed, and the internal pressure of the chamber 90 can set to be a desired value within a short period of time.

FIG. 11 is a view, partially in cross-section, of a main part of a load lock system according to the fourth embodiment of the present invention. A description of portions of the fourth embodiment which are common to the first to third embodiments will be omitted.

In the load lock system of the fourth embodiment, a load lock chamber 120 has a single wall 11. A window 11a is fitted in an upper central portion of the single wall 11 so that infrared rays from a lamp 91 can be radiated on a wafer W through the window 11a. Note that a wafer convey unit 110 has almost the same arrangement as that of the convey mechanism 100 in the third embodiment.

A case wherein the wafer W is conveyed to a process chamber by using such a load lock system will be described below.

The wafer W is loaded into the convey unit 110, and the chamber 120 is evacuated. At the same time, the wafer W is irradiated with infrared rays to be heated. An evacuating operation is controlled by a controller 31. A valve 36 is opened first, and initial evacuation of the chamber 120 is performed by a dry pump 29. A valve 25 is then opened, and final evacuation is performed by a turbo molecular pump 28. With this operation, the chamber 120 is finally evacuated to about $10^{-9}$ Torr. Subsequently, a second gate valve 20 is opened, and the wafer W is conveyed to a process chamber (not shown).

A case wherein a load lock system of the fifth embodiment is applied to an ion implanter will be described below with reference to FIGS. 12 and 13.

Figure 12:
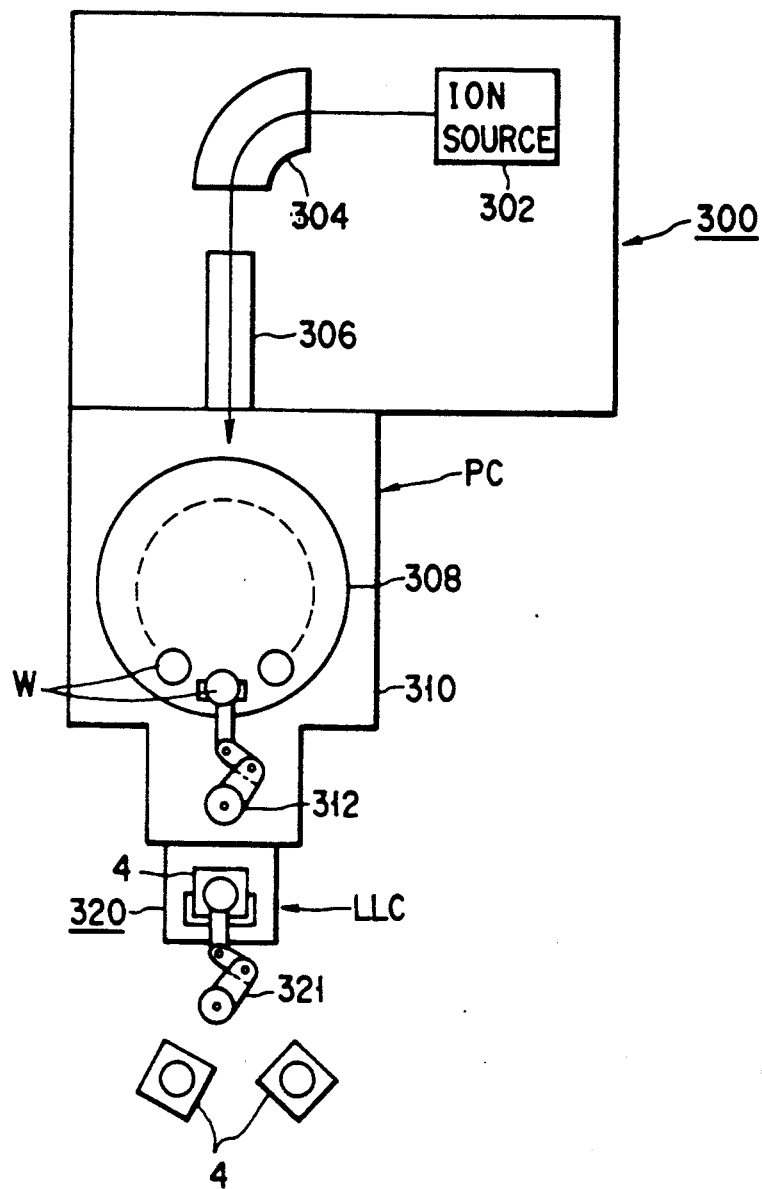
FIG. 12 is a plan view showing the layout of an ion implanter and an attached load lock system.

As shown in the layout of FIG. 12, the ion implanter includes an ion generating section 300, a processing section 310, and a load/unload section 320. An ion source 302, a mass spectrograph 304, and a beam shaper 306 are arranged along the ion path of the ion generating section 300. These components are housed in a hermetic vessel. The vessel is evacuated to a vacuum by an evacuation means (not shown).

The processing section 310 is continuous with the ion generating section 300 to have the same vacuum atmosphere as that of the ion generating section 300. A rotary table 308 and a handling unit 312 are arranged in the processing section 310. A plurality of semiconductor wafers W can be mounted on the upper surface of the rotary table 308 at equal intervals. The rotary table 308 is controlled to be interlocked with the handling unit 312 by a controller (not shown) backed up by a computer system. The handling unit 312 has an extendable articulated arm and a wafer holder.

The load/unload section 320 is continuous with the front surface of the process chamber of the processing section 310. The load/unload section 320 includes a load lock chamber and a convey mechanism 321. A cassette station in which a plurality of cassettes 4 are prepared is disposed behind the convey mechanism 321. Note that this convey mechanism 321 is also controlled by the above-mentioned controller.

Figure 13:
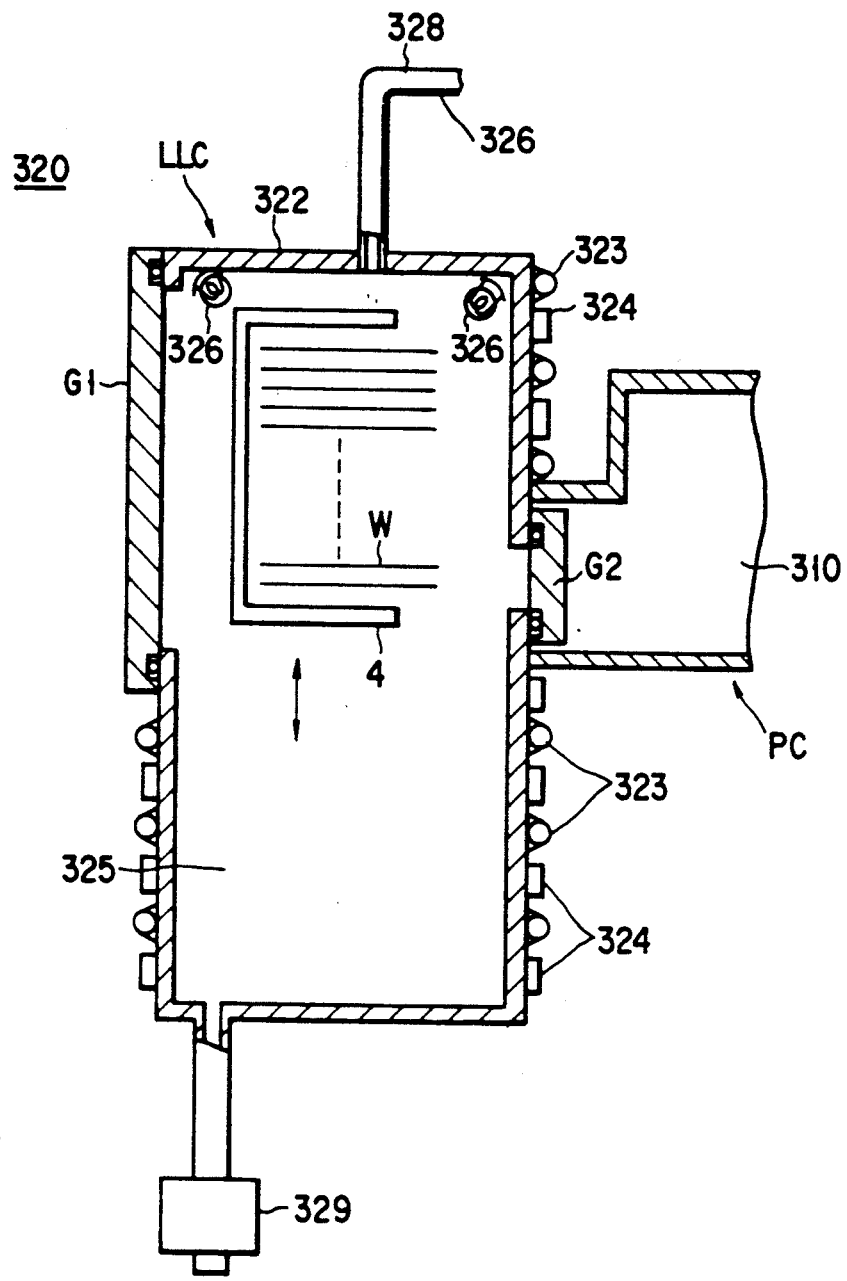
FIG. 13 is a view, partially in cross-section, of a main part of a load lock system according to the fifth embodiment of the present invention.

As shown in FIG. 13, a chamber 322 of the load/unload section 320 is a box-like welded structure which is constituted by a stainless steel plate and measures about 25 cm long, 25 cm wide, and 50 cm high. A refrigerant circulation pipe 323 and a heater 324 are spirally wound around the chamber 322 at a predetermined pitch. The pipe 323 is constituted by a copper pipe having an outer diameter of 6 mm and is brazed to the chamber wall to improve heat conduction. In addition, the two ends of the pipe 323 are connected to a refrigerant temperature controller (not shown) such as a chiller so that a refrigerant circulates in the pipe 323.

The heater 324 is constituted by a sheath heater and is wound around the chamber wall to alternate with the pipe 323. Note that the heater 324 is connected to an external power source (not shown).

A plurality of halogen lamps 326 are fixed to an upper portion of the inner wall of the chamber 322. The lamps 326 serve to heat the wafers W in the cassette 4 in the chamber 322. Note that the cassette 4 is supported by an elevating unit (not shown) to be vertically moved in the chamber 322.

Gate valves G1 and G2 are respectively arranged on opposing side surfaces of the chamber 322. The first gate valve G1 opposes the outer air atmosphere, whereas the second gate valve G2 opposes a process atmosphere.

One end of a gas supply pipe 328 extends through an upper wall portion of the chamber 322 to communicate with the chamber 322. The other end of the gas supply pipe 328 communicates with a nitrogen gas source (not shown).

The suction sides of a rotary pump (not shown) and a turbo molecular pump (not shown) of an evacuation unit 329 communicate with a bottom portion of the chamber 322. The capacity of the rotary pump is 250 l/min. The capacity of the turbo molecular pump is 300 l/sec. This evacuation unit 329 can reduce the internal pressure of the chamber 322 from $10^{-6}$ Torr to $10^{-9}$ Torr.

A case wherein the cassette 4 in which a plurality of processed semiconductor wafers W are stored is placed in the chamber 322, and the semiconductor wafers W are unloaded from the chamber 322 together with the cassette 4 will be described below.

In order to prevent moisture in the atmosphere from adhering to the inner wall of the chamber 322, the heater 324 is turned on in a reduced pressure state to heat the chamber 322 at 140° C. for five minutes. A nitrogen gas is then supplied into the chamber 322 through the gas supply pipe 328 until the internal pressure of the chamber 322 coincides with the atmospheric pressure.

After the internal pressure of the chamber 322 coincides with the atmospheric pressure, the first gate valve G1 is opened to unload the cassette 4. The cassette 4 in which the processed wafers W are stored is unloaded from the chamber 322 by the convey mechanism 321. Thereafter, the cassette 4 in which semiconductor wafers W to be processed are stored is loaded into the camber 322 by the convey mechanism 321.

The first gate valve G1 is closed, and the chamber 322 is evacuated by the evacuation unit 329. Concurrently with this evacuation processing, the halogen lamps 326 are turned on to heat the wafers W in the cassette to about 140° C. This heating operation is performed for about five minutes to evaporate moisture adhering to the wafers W, the cassette 4, and the inner wall of the chamber. With this processing, evacuation of the chamber is promoted, and the internal pressure of the chamber reaches a target value within a short period of time.

Subsequently, the refrigerant is circulated in the pipe 323 to cool the wall of the chamber 322 to room temperature at a rate of 50° C./min to 100° C./min.

After the internal pressure of the chamber 322 reaches the target value, the second gate valve G2 is opened to convey the wafers W from the load/unload section 320 to the processing section 310. The wafers W are placed at predetermined positions on the rotary table 308. When a predetermined number of wafers W are placed on the rotary table 308, the rotary table 308 is erected, and accelerated ions from the ion generating section 300 are implanted into the respective wafers W.

The sixth embodiment of the present invention will be described below with reference to FIG. 14. Note that a description of portions of the sixth embodiment which are common to the fifth embodiment will be omitted.

A chamber 330 of a load lock system of the sixth embodiment is of a sheet-fed type designed to process wafers W one by one. The load lock chamber 330 has a double wall structure constituted by outer and inner walls 331 and 332. The outer wall 331 is designed and manufactured to be mechanically strong because it must mainly withstand the atmospheric pressure. In contrast to this, the inner wall 332 is made thin to improve the heat response characteristic. A region (first space 21) enclosed with the inner wall 332 is to be evacuated to about $1 \times 10^{-9}$ Torr. A region (second space 22) between the inner and outer walls 331 and 332 is to be evacuated to the range of 1 Torr to $1 \times 10^{-4}$ Torr.

The inner wall 332 is designed and manufactured to have a high heat conductivity. A heater 334 and a refrigerant pipe 333, identical to those in the fifth embodiment, are wound around the inner wall 332.

Two evacuation means (not shown) are arranged below the chamber 330. One evacuation means has a rotary pump. The suction side of this rotary pump communicates with the first space 21 through a pipe 348. The capacity of the rotary pump is 250 l/min.

The other evacuation means has a turbo molecular pump. The suction side of this turbo molecular pump communicates with the second space 22 through a pipe 349. The capacity of the turbo molecular pump is 300 l/sec.

A susceptor 340 is stored in the first space 21 of the chamber 330. The susceptor 340 is constituted by an insulating ceramic substrate, in which a heater connected to a lead 346 is embedded. In addition, the susceptor 340 has a pair of plates for cooling the wafers W. Internal paths are formed in the pair of plates to communicate with a refrigerant supply pipe 342 and a refrigerant discharge pipe 344.

Note that the boiling point of water is decreased to 59° C. in a vacuum of 1 Torr. Therefore, if the chamber 330 is in a vacuum of 1 Torr, it is only required that the chamber 330 and the wafer W be heated to 59° C. or more.

A load lock system 400 of the seventh embodiment of the present invention will be described below with reference to FIG. 15.

A load lock chamber 401 is arranged as an attachment for a process chamber for implanting ions into the wafer W. The chamber 401 has two gate valves G1 and G2. The first gate valve G1 serves to isolate the internal atmosphere of the chamber 401 from the outer air atmosphere. The second gate valve G2 serves to isolate the internal atmosphere of the chamber 401 from the internal atmosphere of the process chamber.

A gas supply pipe 403 and an exhaust pipe 402 are disposed in the load lock chamber 401. The gas supply pipe 403 communicates with a hydrogen gas source (not shown), a nitrogen gas source (not shown), and a helium gas source (not shown) through a valve 404.

The exhaust pipe 402 communicates with a turbo molecular pump (not shown) and a rotary pump (not shown). Three valves (not shown) are disposed midway along the exhaust pipe 402. The respective valves are sequentially controlled by a controller (not shown).

A ring-like wafer stage 406 is supported by a support 409. A wafer W is placed on the wafer stage 406. Three lock pins 407 are formed upright on the peripheral upper surface of the stage 406 at equal intervals. Note that a lead extending from the stage 406 is insulated from the bottom portion of the chamber 401 by means of a feedthrough 408 as an insulating member.

In this case, a circuit is formed such that the chamber 401 itself serves as one electrode, while the wafer stage 406 and the support 409 serve as the other electrode. Such a circuit has a power supply section for generating a plasma. The power supply section may be constituted by a DC power supply 411 having a positive pole connected to the chamber 401 and ground and a negative pole connected to the support 409, as indicated by the solid lines in FIG. 15, or may be constituted by a high-frequency power supply 412 and a matching network 413, as indicated by the broken lines in FIG. 15.

An operation of the load lock system 400 will be described next.

The valve 404 is opened to supply a nitrogen gas into the chamber 401 so as to restore the chamber 401 to the atmospheric pressure. Subsequently, the first gate valve G1 is opened, and at the same time a nitrogen gas atmosphere having a pressure higher than the atmospheric pressure is set in the chamber 401 to prevent the entrance of the atmosphere into the chamber 401.

The wafer W to be processed is externally loaded into the chamber 401 and is placed on the stage 406. The first gate valve G1 and the gas supply valve 403 are closed, and the chamber 401 is evacuated by the turbo molecular pump and the rotary pump.

After the internal pressure of the chamber 401 reaches $10^{-3}$ to $10^{-6}$ Torr, the valve 404 is opened to feed a hydrogen gas and a helium gas into the chamber 401 at flow rates of 10 to 500 SCCM. At this time, a DC voltage of 100 to 1,000 V is applied between the electrodes (i.e., between the wall of the chamber 401 and the wafer stage 406) while the internal pressure of the chamber 401 is controlled to be several hundreds mm Torr. In this case, a high-frequency current may be supplied between the electrodes from the high-frequency power supply 412.

Consequently, plasmas are generated on the upper and lower surfaces of the wafer W, and the wafer W is cleaned by the electric discharge caused by these plasmas. That is, moisture, hydrocarbons, and the like adhering to the upper and lower surfaces of the wafer W are removed therefrom. After such discharge cleaning is performed for 10 to 300 seconds, the valve 404 is closed. Subsequently, the second gate valve G2 is opened, and the wafer W is conveyed to the process chamber. By sequentially repeating such operations, the wafers W are conveyed from the atmosphere side to the process chamber through the load lock chamber 401.

According to the load lock chamber 400 of the seventh embodiment, the chamber 410 can be evacuated to a target level within a short period of time. This is because the plasma energy exceeds the adsorption energy of moisture in a wafer surface so that the moisture can be easily removed from the wafer surface owing to the plasma discharge cleaning effect.

In this case, plasma discharge cleaning may be performed in the chamber 401 in a sealed state. However, since there is a possibility that the removed components may partly adhere to the surface of the wafer W again, a gas is preferably circulated in the chamber 401.

In addition, as a gas to be fed, a dry gas whose content of moisture is reduced to the ppb order is preferably used to prevent moisture from being adsorbed in the inner wall of the chamber 401.

A load lock system 420 of the eighth embodiment of the present invention will be described below with reference to FIG. 16. Note that a description of portions of the eighth embodiment which are common to the seventh embodiment will be omitted.

In the load lock system 420, light-transmitting windows 421 and 422 are respectively formed on the upper and lower surfaces of a chamber. Ultraviolet lamps 423 and 424 are arranged to respectively oppose the windows 421 and 422 to radiate ultraviolet rays into the chamber. A wafer stage 406 identical to the one in the seventh embodiment is disposed in the chamber.

In the load lock system 420 having such an arrangement, the ultraviolet lamps 423 and 424 are turned on immediately after a first gate valve G1 is closed. Ultraviolet rays are radiated on a wafer W in the chamber, and components adsorbed in the wafer surface are removed by the radiation energy.

A load lock system 430 of the ninth embodiment of the present invention will be described below with reference to FIG. 17. Note that a description of portions of the ninth embodiment which are common to the seventh embodiment will be omitted.

In the load lock system 430, light-transmitting windows 431 and 432 are respectively formed on the upper and lower surface of a chamber. The windows 431 and 432 respectively oppose reflectors M3 and M4. The reflectors M3 and M4 respectively reflect laser beams emitted from a laser source 436 through half mirrors M1 and M2 to irradiate the surface of the wafer W with the reflected laser beams.

In this case, the optical path extending from the laser source 436 may be branched into upper and lower paths through the half mirrors M1 and M2 so that the incident angles can be changed by pivoting the reflectors M3 and M4 arranged on the respective branch optical paths. With this arrangement, the entire surface of the wafer W can be irradiated with laser beams.

The present invention is not limited the above-described embodiment. As the means for providing energy required to remove adsorbed components from the wafer W, a means which does not raise the temperature in the chamber is preferably used. This is because an increase in temperature leads to an increase in vapor pressure of each adsorbed component, and the gaseous component amount in the chamber is increased accordingly.

In the above embodiment, the load lock system of a sheet-fed type is exemplified. The present invention is not limited to this but can be applied to a batch type system designed to load a plurality of wafers into a chamber at once. In this case, since the total amount of components adsorbed in wafers is increased, removal and cleaning of the components can be more effectively performed.

Figure 18:
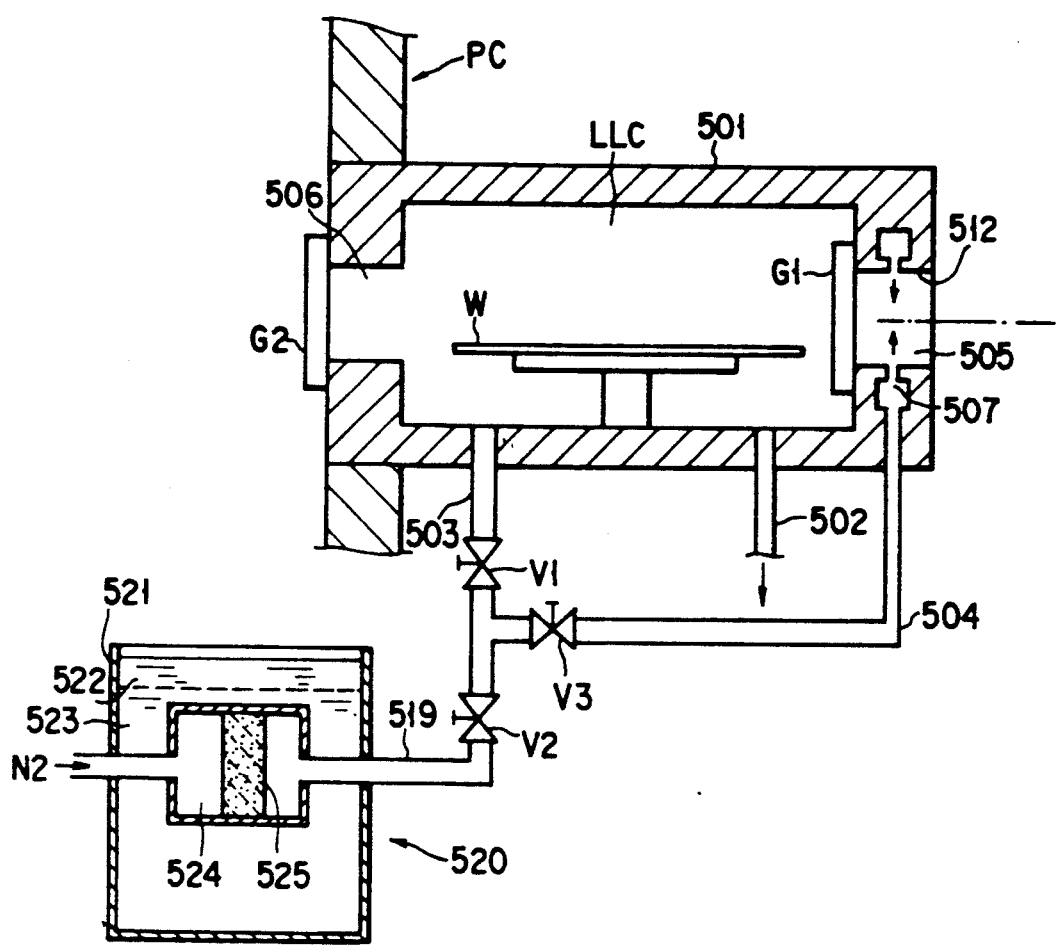
FIG. 18 is a longitudinal sectional view showing a main part of a load lock system according to the tenth embodiment of the present invention.

A load lock system 500 of the tenth embodiment of the present invention will be described below with reference to FIGS. 18 and 19. Note that a description of portions of the tenth embodiment which are common to the above-described embodiments will be omitted.

The load lock system 500 is disposed adjacent to a process chamber for performing ion implantation and the like. An exhaust pipe 502, a gas supply pipe 503, and a gas injection pipe 504 communicate with a load lock chamber 501. In addition, the gas supply pipe 503 and the gas injection pipe 504 communicate with a trap unit 520.

The gas supply pipe 503 communicates with a nitrogen gas source (not shown) through valves V1 and V2 and the trap unit 520. The gas supply pipe 503 is used to feed a nitrogen gas into the chamber 501 to increase the internal pressure to a value (positive pressure) higher than the atmospheric pressure.

The trap unit 520 includes a cooling trough 521 and a trap chamber 524. The cooling trough 521 contains cooling liquids such as an ethanol solution 523 and liquid nitrogen 522. The trap chamber 524 is dipped in the ethanol solution 523 in the cooling trough 521. A filter 525 is arranged in the trap chamber 524. The filter 525 is composed of an SUS sintered material.

Note that the ethanol solution 523 is covered with the liquid nitrogen 522 in the cooling trough 521. With this arrangement, the ethanol solution 523 is maintained at about $-100°$ C. and is prevented from being frozen.

According to the trap unit 520 having such an arrangement, when a nitrogen gas passes through the filter 525 cooled to about $-100°$ C., moisture contained in the gas is condensed and removed. As a result, the content of moisture of the nitrogen gas is decreased to the ppb order.

Opening portions 505 and 506 are respectively formed in side walls of the load lock chamber 501 to communicate with the atmosphere and the vacuum process chamber. Gate valves G1 and G2 capable of being opened/closed are respectively arranged in these rectangular opening portions 505 and 506. A wafer stage 511 is disposed in the load lock chamber 501.

An injection port 507 of the gas injection pipe 504 is formed to surround the opening portion 505 on the side of the first gate valve G1. This injection port 507 has a slit-like shape having a width of about 0.1 mm. When a high-pressure gas is injected from the port 507, the opening portion 505 is closed by the injected gas.

Figure 19:
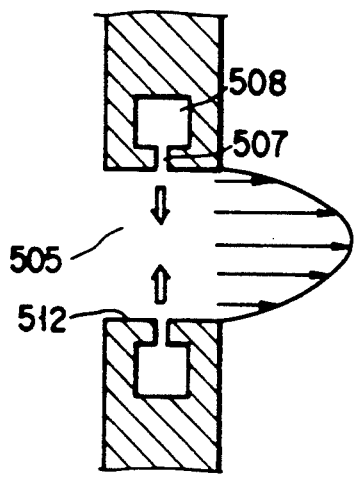
FIG. 19 is an enlarged longitudinal sectional view showing an opening portion of a load lock chamber in the tenth embodiment.

As shown in FIG. 19, the slit-like injection port 507 communicates with a ventilation chamber 508 having a 1-cm square cross-section. This ventilation chamber 508 is formed to surround the opening portion 505.

An operation of the load lock system 500 will be described next.

A wafer W to be processed is conveyed from the load lock chamber 501 to the process chamber. The second gate valve G2 is then closed, and the next wafer is about to be loaded from the atmosphere side into the chamber 501.

The valves V1 to V3 are opened first, and a superdry nitrogen gas (whose content of moisture is on the ppb order) is fed into the load lock chamber 501. Meanwhile, a nitrogen gas is injected from the injection port 507. When the load lock chamber 501 is filled with the nitrogen gas, and the internal pressure exceeds the atmospheric pressure, the first gate valve G1 is opened.

In this case, the flow speed distribution indicated by FIG. 19 tends to appear in the opening portion 505. This is because the nitrogen gas in the load lock chamber 501 is blown out through the opening portion 505. Since the gas flow speed is decreased in a peripheral region of the opening portion 505, outer air tends to enter the chamber 501 along the peripheral region. However, the outer air is blocked by the gas injected from the injection port 507 and is pushed back to the atmosphere side.

According to the tenth embodiment, since the superdry gas whose content of moisture is on the ppb order is fed into the load lock chamber 501, the amount of moisture in the chamber 501 is greatly reduced.

Note that the first gate valve G1 is preferably arranged at the opening portion 505 on the load lock chamber 501 side. This is because a nitrogen gas can be injected from the injection port 507 even while the first gate valve G1 is closed. In contrast to this, if the first gate valve G1 is arranged at the opening portion 505 on the atmosphere side, the atmosphere can easily enter the chamber 501 when the gate valve G1 is opened/closed. Therefore, such an arrangement is not preferable.

Note that an argon gas or dry air may be used, as the gas to be injected, in place of a nitrogen gas.

The eleventh embodiment of the present invention will be described below with reference to FIGS. 20 to 22.

Figure 20:
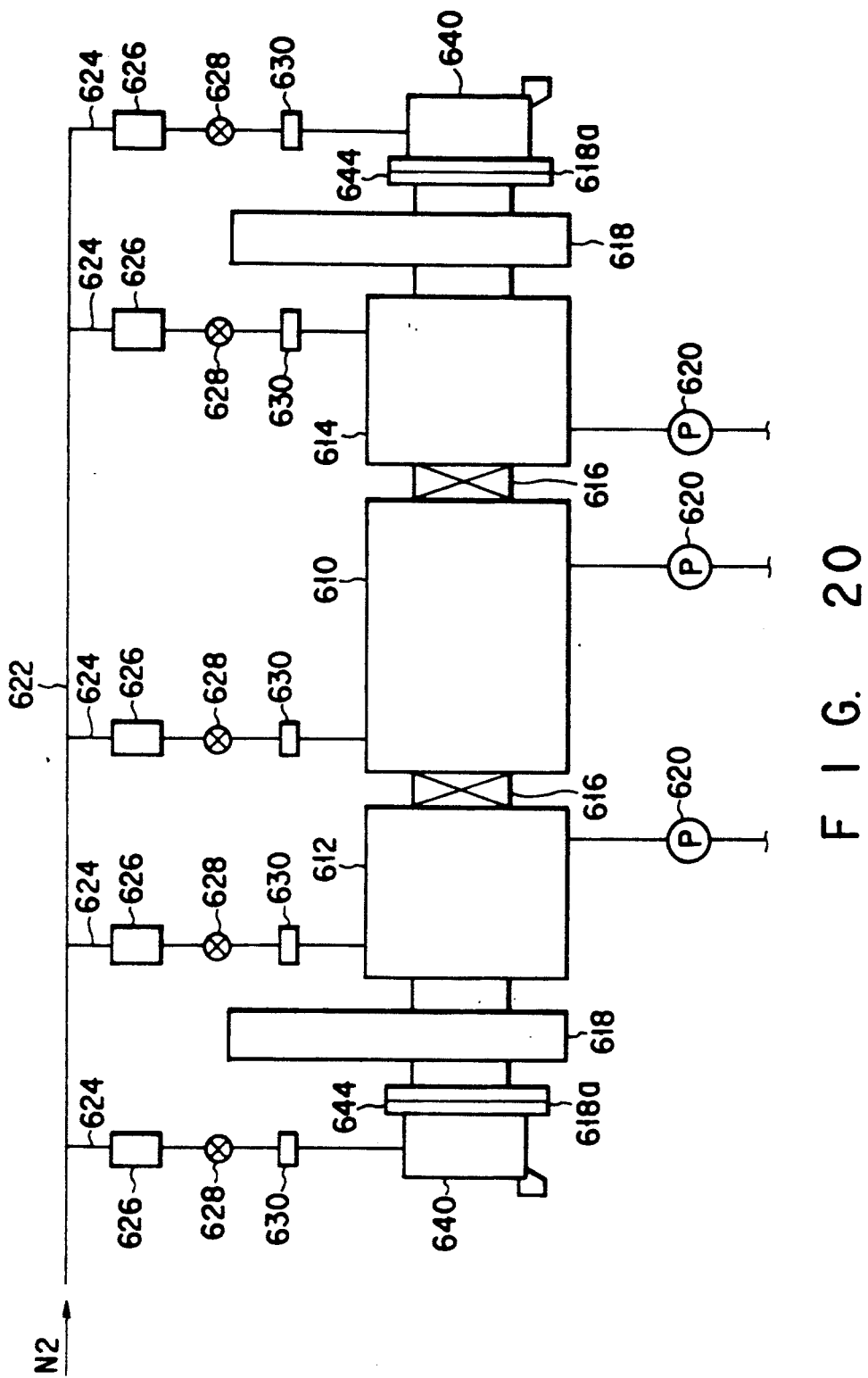
FIG. 20 is a block diagram showing the overall arrangement of a load lock system according to the eleventh embodiment of the present invention.

The overall arrangement of an apparatus according to this embodiment will be briefly described first with respect to FIG. 20. Referring to FIG. 20, a process chamber 610 is a reduced pressure processing apparatus designed to perform etching, ashing, ion implantation, or various types of film formation processes. Load-side and unload-side load lock chambers 612 and 614 are coupled to both the sides of the process chamber 610 through gate valves 616. In addition, gate valves 618 for blocking the atmosphere are respectively coupled to the load lock chambers 612 and 614.

In the load lock chamber 610, after the gate valves 616 and 618 on the two sides are closed, the atmospheric pressure is substituted with a vacuum atmosphere. After the internal pressure of the chamber 610 becomes almost equal to that of the chamber 612, the gate valve 616 between the two chambers is opened. Thereafter, a semiconductor wafer W is loaded into the process chamber 610. After evacuation processing in the process chamber 610 is completed, the gate valve 616 is opened to load the wafer W into the load lock chamber 614. The gate valve 616 is then opened to increase the internal pressure of the load lock chamber 614 to a value higher than the atmospheric pressure. Subsequently, the unload-side gate valve 618 is opened, and the wafer W is unloaded.

Vacuum pumps 620 for evacuation respectively communicate with the chambers 610, 612, and 614. In addition, the internal pressures of the respective chambers 610, 612, and 614 can be increased to the atmospheric pressure or a pressure slightly higher or lower than the atmospheric pressure. The interiors of the chambers 610, 612, and 614 can be purged by using a nitrogen gas $N_2$.

Furthermore, in the apparatus of this embodiment, purge blocks 640 are respectively coupled to the front and rear portions of the reduced pressure processing system which are adjacent to the atmosphere. These purge blocks can also be purged by a nitrogen gas $N_2$. For this purpose, an $N_2$ gas supply pipe 622 common to the respective components is arranged. This gas supply pipe 622 is branched into branch pipes 624 which are respectively coupled to the chambers 610, 612, and 614 and the purge blocks 640. An MFC 626, a Valve 628, and a filter 630 are arranged midway along each branch pipe 624. Note that each filter 630 is capable of trapping a particle having a diameter of, e.g., 0.01 $\mu$m or more.

Each purge block 640 includes a pair of right and left side walls 642a opposing each other, a bottom wall 642b, and an upper wall 642c. A path 642 for the semiconductor wafer W is defined by these walls. A flange 644 is formed at one end of the path 642. The flange 644 is coupled to a valve-side flange 618a of the gate valve 618 by bolts, nuts, an the like.

A purge box 646 is fixed to the upper wall 642c of the purge block 640 such that a space 648 is defined between the box 646 and the upper wall 642c. One end of the branch pipe 624 is coupled to the purge box 646 so that a nitrogen gas can be fed into the box 646.

In addition, first to fourth slits 650 to 656 extend through the upper wall 642c of the purge block 640 from the upper surface to the lower surface so as to be open almost throughout in the direction of width of the path 642. The respective slits 650 to 656 cause the space 648 in the purge box 646 to communicate with the path 642 so that a nitrogen gas can be purged from the space 648 to the path 642.

The slit 650 is formed as the first slit nearest to the outer atmosphere. The first slit 650 is inclined toward the outer atmosphere at an angle $\theta_1$ with respect to the vertical axis as it extends from the space 648 to the path 642. The slits 652 and 654 are formed as the second and third slits. Similarly, the second and third slits are respectively inclined at angles $\theta_2$ and $\theta_3$ with respect to the vertical axis. The fourth slit 656 is formed parallel to the vertical axis. The inclination angles $\theta_1$ to $\theta_3$ of the first to third slits 650 to 654 are increased with an increase in distance from the outer atmosphere. That is, $\theta_1 < \theta_2 < \theta_3$.

First to third guide plates 658 to 662 are fixed in the path 642 of the purge block 640. The first to third guide plates 658 to 662 extend inward from each of the two side walls 642a by a predetermined length. The first to third guide plates 658 to 662 are positioned to oppose the first to third slits 650 to 654 so as to guide a nitrogen gas injected from the respective slits 650 to 654 along the inclination angles $\theta_1$ to $\theta_3$ of the slits. The upper ends of the guide plates 658 to 662 are located almost in contact with the upper wall 642c, whereas their lower ends are spaced apart from the bottom wall 642b. Note that the effective passage width for a semiconductor wafer is a width $W_1$ between the first guide plates 658 on the two sides, as shown in FIG. 22.

The shape of the bottom wall 642b of the path 642 will be described next.

An opening end portion of the bottom wall 642b is formed as an inclined surface 664 which is inclined downward toward the distal end. In addition, the distal end of the inclined surface 664 is coupled to a horizontal protruding surface 666 which horizontally protrudes from the opening portion of the purge block 640 to the outer atmosphere side. In the region defined by the inclined surface 664 and the horizontal protruding surface 666, a large number of baffle plates 668 are arranged parallel to each other at predetermined intervals in the direction of width of the purge block 640 in such a manner that the upper end of each baffle plate 668 protrudes from the bottom wall 642b.

Furthermore, a corrugated plate 670 is formed on the upper surface of the bottom wall 642b in a region located inside the inner end of each of the baffle plates 668 so as to extend throughout the direction of width of the purge block 640. Note that the respective members constituting the purge block 640 are composed of stainless steel and are coupled to each other by, e.g., spot welding.

A function of the apparatus will be described below.

A case wherein a semiconductor wafer is loaded into the process chamber 610 will be described below. In this case, the gate valves 616 and 618 on the two sides of the load-side load lock chamber 612 are closed in advance, and the internal pressure of the load lock chamber 612 is set to be higher than the atmospheric pressure. For this purpose, a nitrogen gas is supplied into the load lock chamber 612 through the gas supply pipe 622 and the branch pipe 624.

If the gate valve 618 is opened after a positive pressure is set in the load lock chamber 612, the atmosphere does not theoretically flow into the load lock chamber 612 at the positive pressure. However, even such a measure for blocking the atmosphere is not sufficient in consideration of the evacuation time required afterward in the load lock chamber 612. In the apparatus of this embodiment, therefore, purge blocks 640 are further arranged outside the gate valves 618.

A nitrogen gas is constantly supplied into the purge box 646 of the purge block 640 during an operation of the system regardless of, e.g., an switching operation of the gate valve 618. As a result, the nitrogen gas is injected from the space 648 of the purge box 646 toward the path 642 through the first to fourth slits 650 to 656.

Figure 21:
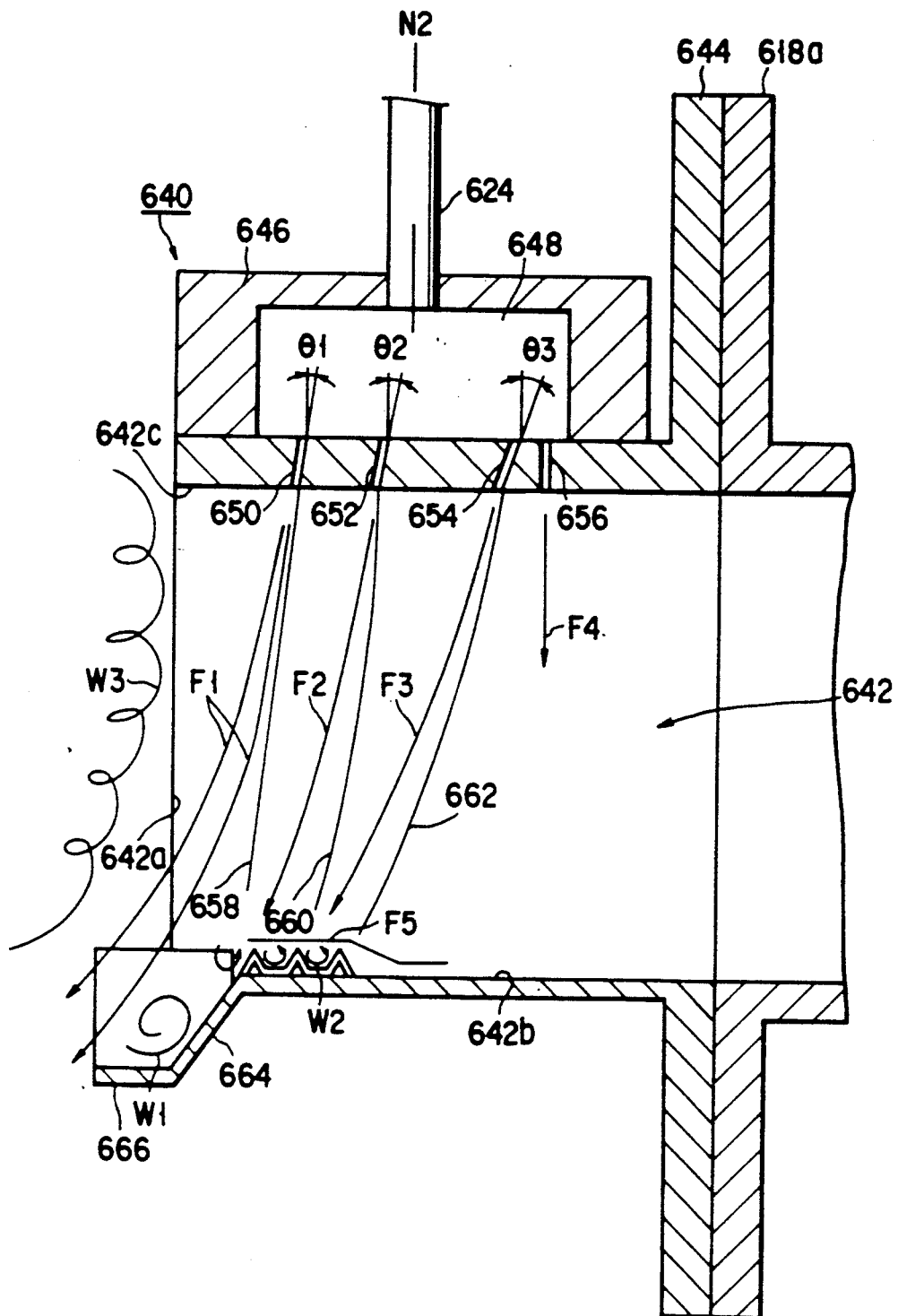
FIG. 21 is a longitudinal sectional view showing an opening portion of the load lock system of the eleventh embodiment.

Reference symbols $F_1$ to $F_4$ in FIG. 21 indicate the flows of a nitrogen gas injected from the first to fourth slits 650 to 656. These nitrogen gas flows $F_1$ to $F_4$ form a multistage curtain crossing the loading direction of the semiconductor wafer W. This multistage curtain serves to prevent the atmosphere from flowing into the vacuum side. In particular, gas curtains $F_1$ to $F_3$ formed by the first to third slits 650 to 654 are inclined toward the outer air atmosphere side as they extend downward from the upper end of the path 642. Therefore, the atmosphere about to flow into the opening portion of the purge block 640 follows the flows of the three gas curtains and flows outside from the opening portion of the purge block 640.

The nitrogen gas flow $F_4$ from the fourth slit 656 enhances the tendency that the internal pressure of the path 642 of the purge block 640 exceeds the atmospheric pressure. When the multistage gas curtain is formed in the purge block 640 in this manner, since the gas injection pressure near the upper wall 642c is high, the atmosphere about to flow along the upper wall 642c is caused to flow outside the purge block 640 along the gas curtains $F_1$ to $F_3$.

Theoretically, the flow speeds of a nitrogen gas on the inner surfaces of the side walls of the purge block 640 are zero. Therefore, the atmosphere tends to flow into the purge block 640 along the surfaces of the two side walls 642a. However, in the apparatus of this embodiment, since the first to third guide plates 658 to 662 extend inward from the two side walls 642a, the flow of the atmosphere is blocked and is guided outside the purge block 640 along the gas curtains $F_1$ to $F_3$.

The reason why the inclined surface 664 and the horizontal protruding surface 666 are formed near the outlet of the bottom wall 642b of each purge block 640 will be described below.

In the apparatus of this embodiment, since a nitrogen gas is injected from the slits formed in the upper wall 642c, the pressure of the nitrogen gas is minimized in a region near the bottom wall 642b, and the atmosphere flows into the purge block 640 more easily through this region than through other regions. Furthermore, in a region where the flow of the nitrogen gas is weak, a whirlpool $W_1$ shown in FIG. 21 is formed. If this whirlpool $W_1$ is formed above the bottom wall 642b, a flow swallowing up the atmosphere is formed in the path 642 for semiconductor wafers. In the apparatus of this embodiment, since the inclined surface 664 and the horizontal protruding surface 666 are formed, the whirlpool $W_1$ is formed outside the path 642 to prevent the atmosphere from being swallowed up. In addition, the large number of baffle plates 668 are formed parallel to each other near the outlet of the bottom wall 642b at the predetermined intervals along the direction of width so as to form a smooth flow directed toward the outside of the gas curtains $F_1$ to $F_3$ in the region where the gas pressure is low, thereby preventing the atmosphere from being swallowed up.

The reason why the corrugated plate 670 is formed on the upper surface of the bottom wall 642b in the region inside the baffle plates 668 will be described next. Theoretically, the flow of a nitrogen gas on the bottom wall 642b is also zero. The first object of the corrugated plate 670 is to physically prevent the atmosphere from flowing into the purge block 640 along the bottom wall 642b. In addition, the corrugated plate 670 serves to confine whirlpools $W_2$ in its recess regions and form a flow $F_5$ like a laminar flow extending along a direction parallel to a line connecting the ridges of the corrugated portions of the corrugated plate 670 and directed outward from the purge block 640. The formation of this flow $F_5$ prevents the atmosphere from being swallowed up through the region near the bottom wall 642b in which the gas pressure is minimized. Owing to the above-described effects, the flow of the atmosphere near the opening portion of the purge block 640 becomes a flow $W_3$ in FIG. 21, thus preventing the atmosphere from being swallowed up in the purge block 640.

The twelfth embodiment of the present invention will be described below with reference FIGS. 23 to 25.

As shown in FIG. 23, in this system, a wafer W is conveyed from a sender 701 to a receiver 702 through a process chamber 703. The process chamber 703 is used to perform etching, ashing, CVD, or the like with respect to the semiconductor wafer W in a vacuum. A stocker 706 and a load lock chamber 704 are disposed between the sender 701 and the process chamber 703. A load lock chamber 705 is disposed between the process chamber 703 and the receiver 702. Gate valves G are respectively arranged between the chamber components 701 to 706. In addition, wafer convey mechanisms (not shown) are respectively arranged between the chambers.

The internal pressure of the stocker 706 is normally set to be lower than that of the process chamber 703, e.g., $10^{-5}$ to $10^{-6}$ Torr. In addition, the internal pressure of the load lock chamber 704 is set to be almost equal to or higher than that of the process chamber 703, e.g., $10^{-9}$ Torr.

As shown in FIG. 24, a trap unit 709 is arranged in the load lock chamber 704. A heat exchange path 710 is formed in the trap unit 709. The heat exchange path 710 is bent in the form of a radiator in a wafer holding portion of the trap unit 709. The heat exchange path 710 communicates with a refrigerant source, e.g., a liquid nitrogen or freon source, or a heat transfer medium source, e.g., a hot water or hot air source.

A large number of holes 711 are formed in the wafer holding portion of the unit 709. Infrared rays from a pair of lamps 714 are radiated on the wafer W through the holes 711.

Note that the lamps 714 are mounted in a housing 715b fixed on a window portion 715 with bolts. A view port 715a constituted by a thick transparent glass plate is fixed to the window portion 715 to transmit heat radiation from the infrared lamps 714. A seal member 715c is disposed on the peripheral portion of the view port 715a to hermetically seal the housing 715b. Infrared rays emitted from the infrared lamps 714 serve to remove gases of moisture and the like adsorbed in the surface of the semiconductor wafer W.

An operation of the unit will be described below with reference to FIGS. 25(a) to 25(d).

The load lock chamber 704 is evacuated first to a vacuum of about $10^{-5}$ to $10^{-6}$ Torr. At the same, a trap chamber (not shown) adjacent to the load lock chamber 704 is evacuated in the same manner.

As shown in FIG. 25(a), in the trap chamber, a liquid nitrogen ($-194°$ C.) is circulated/supplied into the trap unit 709 to cool it. As shown in FIG. 25(b), the gate valve G between the load lock chamber 704 and the trap chamber is opened, and an operation rod is operated to guide the trap unit 709 into the load lock chamber 704 along a guide rail.

When the cooled trap unit 709 is guided in the chamber 704, the vacuum in the load lock chamber 704 is changed on the order of $10^2$ to $10^3$ and becomes about $10^{-8}$ to $10^{-9}$ Torr, for example.

As shown in FIG. 25(c), the gate valve G between the load lock chamber 704 and the stocker 706 is opened in this state, and the semiconductor wafer W is conveyed from the stocker 706 into the load lock chamber 704.

As shown in FIG. 25(d), the gate valve G is closed, and infrared rays are radiated from the infrared lamps 714 onto the semiconductor wafer W in the trap unit 709.

The degree of heating by the infrared lamps 714 depends on the size and the like of the wafer W. Generally, by radiating infrared rays for about 20 seconds, the wafer W is heated to about 200° C. As a result, components adsorbed in the semiconductor wafer surface are desorbed, and the desorbed components adhere to the heat exchange path 710. With this operation, the internal pressure of the chamber is maintained at $10^{-8}$ to $10^{-9}$ Torr.

When the trap unit 709 is saturated, it is returned to the trap chamber. Subsequently, a switching valve is switched to circulate hot water in the heat exchange path 710. With this operation, the components adhering to the trap unit 709 are detached, and the detached components are exhausted from the trap chamber.

In this manner, the trap unit 709 is loaded and unloaded into and from the load lock chamber 704, and cooling and heating operations are repeated so that gases adsorbed in a wafer placed in the load lock chamber 704 can be easily removed without replacing the trap unit 709, and a predetermined vacuum can be quickly achieved.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A reduced pressure processing system comprising:
   a load lock chamber having outer and inner walls and at least one opening communicating with at least one of an outer air atmosphere and a process atmosphere in which a substrate is processed;
   gate means for closing said opening so as to separate an interior of said chamber from at least one of the outer air atmosphere and the process atmosphere, and for opening said opening so as to make the interior of said chamber communicate with at least one of the outer air atmosphere and the process atmosphere;
   convey means for loading/unloading the substrate through said opening into/out of a first space which is surrounded by said inner wall and said gate means;
   evacuation means for evacuating said chamber, said evacuation means including a first evacuator for evacuating said first space and a second evacuator for evacuating a second space which is surrounded by said outer and inner walls;
   gas supply means for supplying a gas into said first and second spaces;
   first heating means for heating said inner wall; and
   differential pressure detecting means for detecting a difference in pressure within said first and second spaces and providing a signal of said pressure difference to a control means for controlling at least one of said evacuation means and said gas supply means;
   wherein the inner wall is thinner than the outer wall.

2. A system according to claim 1, further comprising stage means, arranged in said first space, for allowing the substrate to be placed thereon, and stage heating means for heating said stage means.

3. A system according to claim 2, wherein said stage heating means comprises an electric heater embedded in a member constituting said stage means.

4. A system according to claim 2, further comprising cooling means for cooling said stage means.

5. A system according to claim 4, wherein said cooling means comprises a refrigerant path formed in a member constituting a part of said stage means.

6. A system according to claim 1, wherein said convey means is supported by a support member on the inner wall defining said first space.

7. A system according to claim 6, further comprising second heating means for heating a substrate holding portion of said convey means.

8. A system according to claim 1, further comprising heat energy radiating means arranged outside said chamber, and a plurality of heat-energy-transmitting windows in said outer and inner walls, for permitting heat energy from said heat energy radiating means to be radiated onto the substrate.

9. A system according to claim 1, further comprising cooling means for cooling the inner wall.

* * * * *